United States Patent
Karnezos et al.

(10) Patent No.: US 7,429,787 B2
(45) Date of Patent: *Sep. 30, 2008

(54) SEMICONDUCTOR ASSEMBLY INCLUDING CHIP SCALE PACKAGE AND SECOND SUBSTRATE WITH EXPOSED SURFACES ON UPPER AND LOWER SIDES

(75) Inventors: Marcos Karnezos, Palo Alto, CA (US); IL Kwon Shim, Singapore (SG); Byung Joon Han, Singapore (SG); Kambhampati Ramakrishna, Chandler, AZ (US); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 23 days.

This patent is subject to a terminal disclaimer.

(21) Appl. No.: 11/397,027

(22) Filed: Mar. 31, 2006

(65) Prior Publication Data

US 2006/0220210 A1    Oct. 5, 2006

Related U.S. Application Data

(63) Continuation-in-part of application No. 11/306,628, filed on Jan. 4, 2006, now Pat. No. 7,364,945.

(60) Provisional application No. 60/667,277, filed on Mar. 31, 2005, provisional application No. 60/692,183, filed on Jun. 20, 2005.

(51) Int. Cl.
*H01L 23/02* (2006.01)
*H01L 21/00* (2006.01)
*H05K 1/14* (2006.01)

(52) U.S. Cl. .............. 257/686; 257/730; 257/784; 257/787; 257/E25.006; 257/E25.013; 361/736; 361/748; 361/772; 438/107; 438/118; 438/125; 438/126; 438/617

(58) Field of Classification Search .................. None
See application file for complete search history.

(56) References Cited

U.S. PATENT DOCUMENTS 5,222,014 A   6/1993  Lin (Continued)

FOREIGN PATENT DOCUMENTS

| EP | 0 430 458 A2 | 6/1991 |
|---|---|---|
| EP | 0 652 630 A2 | 5/1995 |
| JP | 05152505 A | 6/1993 |
| JP | 2001223326 A | 8/2001 |
| KR | 20010688614 A | 7/2001 |
| KR | 2004085348 A | 10/2004 |
| WO | WO 98/50954 A1 | 11/1998 |
| WO | WO 02/084716 A2 | 10/2002 |
| WO | WO 03/032370 A2 | 4/2003 |

OTHER PUBLICATIONS

International Search Report and Written Opinion for corresponding International Application No. PCT/US06/11712 dated Mar. 1, 2007.

(Continued)

*Primary Examiner*—Alonzo Chambliss

(57) ABSTRACT

Semiconductor assemblies include a first package, each having at least one die affixed to, and electrically interconnected with, a die attach side of the first package substrate, and a second substrate having a first side and a second ("land") side, mounted over the molding of the first package with the first side of the second substrate facing the die attach side of the first package substrate. Z-interconnection of the package and the substrate is by wire bonds connecting the first and second substrates. The assembly is encapsulated with both the land side of the second substrate and a portion of the land side of the first package substrate exposed, so that second level interconnection and interconnection with additional components may be made.

17 Claims, 16 Drawing Sheets

U.S. PATENT DOCUMENTS

| | | | |
|---|---|---|---|
| 5,229,960 | A | 7/1993 | De Givry |
| 5,340,771 | A | 8/1994 | Rostoker |
| 5,373,189 | A | 12/1994 | Massit et al. |
| 5,436,203 | A | 7/1995 | Lin |
| 5,444,296 | A | 8/1995 | Kaul et al. |
| 5,495,398 | A | 2/1996 | Takiar et al. |
| 5,550,711 | A | 8/1996 | Burns et al. |
| 5,652,185 | A | 7/1997 | Lee |
| 5,744,863 | A | 4/1998 | Culnane et al. |
| 5,898,219 | A | 4/1999 | Barrow |
| 5,899,705 | A | 5/1999 | Akram |
| 5,903,049 | A | 5/1999 | Mori |
| 5,977,640 | A | 11/1999 | Bertin et al. |
| 5,982,633 | A | 11/1999 | Jeansonne |
| 5,994,166 | A | 11/1999 | Akram et al. |
| 6,025,648 | A | 2/2000 | Takahashi et al. |
| 6,034,875 | A | 3/2000 | Heim et al. |
| 6,075,289 | A | 6/2000 | Distefano |
| 6,083,775 | A | 7/2000 | Huang et al. |
| 6,118,176 | A | 9/2000 | Tao et al. |
| 6,133,626 | A | 10/2000 | Hawke et al. |
| 6,157,080 | A | 12/2000 | Tamaki et al. |
| 6,165,815 | A | 12/2000 | Ball |
| 6,201,266 | B1 | 3/2001 | Ohuchi et al. |
| 6,201,302 | B1 | 3/2001 | Tzu |
| 6,238,949 | B1 | 5/2001 | Nguyen et al. |
| 6,265,766 | B1 | 7/2001 | Moden |
| 6,274,930 | B1 | 8/2001 | Vaiyapuri et al. |
| 6,316,838 | B1 | 11/2001 | Ozawa et al. |
| 6,333,552 | B1 | 12/2001 | Kakimoto et al. |
| 6,340,846 | B1 | 1/2002 | LoBianco et al. |
| 6,376,904 | B1 | 4/2002 | Haba et al. |
| 6,388,313 | B1 | 5/2002 | Lee et al. |
| 6,400,007 | B1 | 6/2002 | Wu et al. |
| 6,407,456 | B1 | 6/2002 | Ball |
| 6,413,798 | B2 | 7/2002 | Asada |
| 6,414,381 | B1 | 7/2002 | Takeda |
| 6,424,050 | B1 | 7/2002 | Komiyama |
| 6,441,496 | B1 | 8/2002 | Chen et al. |
| 6,445,064 | B1 | 9/2002 | Ishii et al. |
| 6,462,421 | B1 | 10/2002 | Hsu et al. |
| 6,472,732 | B1 | 10/2002 | Terui |
| 6,489,676 | B2 | 12/2002 | Taniguchi et al. |
| 6,492,726 | B1 | 12/2002 | Quek et al. |
| 6,501,165 | B1 | 12/2002 | Farnworth |
| 6,509,639 | B1 | 1/2003 | Lin |
| 6,512,303 | B2 | 1/2003 | Moden |
| 6,538,319 | B2 | 3/2003 | Terui |
| 6,545,365 | B2 | 4/2003 | Kondo et al. |
| 6,545,366 | B2 | 4/2003 | Michii et al. |
| 6,552,423 | B2 | 4/2003 | Song et al. |
| 6,555,902 | B2 | 4/2003 | Lo et al. |
| 6,555,917 | B1 | 4/2003 | Heo |
| 6,570,249 | B1 | 5/2003 | Liao et al. |
| 6,583,503 | B2 | 6/2003 | Akram et al. |
| 6,590,281 | B2 | 7/2003 | Wu et al. |
| 6,593,647 | B2 | 7/2003 | Ichikawa |
| 6,593,648 | B2 | 7/2003 | Emoto |
| 6,593,662 | B1 | 7/2003 | Pu et al. |
| 6,599,779 | B2 | 7/2003 | Shim et al. |
| 6,607,937 | B1 | 8/2003 | Corisis |
| 6,611,063 | B1 | 8/2003 | Ichinose et al. |
| 6,621,169 | B2 | 9/2003 | Kikuma et al. |
| 6,621,172 | B2 | 9/2003 | Nakayama et al. |
| 6,649,448 | B2 | 11/2003 | Tomihara |
| 6,650,019 | B2 | 11/2003 | Glenn et al. |
| 6,667,556 | B2 | 12/2003 | Moden |
| 6,690,089 | B2 | 2/2004 | Uchida |
| 6,700,178 | B2 | 3/2004 | Chen et al. |
| 6,706,557 | B2 | 3/2004 | Koopmans |
| 6,716,670 | B1 | 4/2004 | Chiang |
| 6,734,539 | B2 | 5/2004 | Degani et al. |
| 6,734,552 | B2 | 5/2004 | Combs et al. |
| 6,737,750 | B1 | 5/2004 | Hoffman et al. |
| 6,746,894 | B2 | 6/2004 | Fee et al. |
| 6,747,361 | B2 | 6/2004 | Ichinose |
| 6,762,488 | B2 | 7/2004 | Maeda et al. |
| 6,777,799 | B2 | 8/2004 | Kikuma et al. |
| 6,777,819 | B2 | 8/2004 | Huang |
| 6,787,915 | B2 | 9/2004 | Uchida et al. |
| 6,787,916 | B2 | 9/2004 | Halahan |
| 6,794,741 | B1 | 9/2004 | Lin et al. |
| 6,794,749 | B2 | 9/2004 | Akram |
| 6,818,980 | B1 | 11/2004 | Perdon, Jr. |
| 6,828,665 | B2 | 12/2004 | Pu et al. |
| 6,835,598 | B2 | 12/2004 | Baek et al. |
| 6,838,761 | B2 | 1/2005 | Karnezos |
| 6,847,105 | B2 | 1/2005 | Koopmans |
| 6,861,288 | B2 | 3/2005 | Shim et al. |
| 6,864,566 | B2 | 3/2005 | Choi, III |
| 6,882,057 | B2 | 4/2005 | Hsu |
| 6,890,798 | B2 | 5/2005 | McMahon |
| 6,900,528 | B2 | 5/2005 | Mess et al. |
| 6,906,415 | B2 | 6/2005 | Jiang et al. |
| 6,906,416 | B2 | 6/2005 | Karnezos |
| 6,930,378 | B1 | 8/2005 | St. Amand et al. |
| 6,930,396 | B2 | 8/2005 | Kurita et al. |
| 6,933,598 | B2 | 8/2005 | Karnezos |
| 6,951,982 | B2 | 10/2005 | Chye et al. |
| 6,972,481 | B2 | 12/2005 | Karnezos |
| 7,034,387 | B2 | 4/2006 | Karnezos |
| 7,034,388 | B2 | 4/2006 | Yang et al. |
| 7,045,887 | B2 | 5/2006 | Karnezos |
| 7,049,691 | B2 | 5/2006 | Karnezos |
| 7,053,476 | B2 | 5/2006 | Karnezos |
| 7,053,477 | B2 | 5/2006 | Karnezos |
| 7,057,269 | B2 | 6/2006 | Karnezos |
| 7,061,088 | B2 | 6/2006 | Karnezos |
| 7,064,426 | B2 | 6/2006 | Karnezos |
| 7,071,568 | B1 | 7/2006 | St. Amand et al. |
| 7,081,678 | B2 | 7/2006 | Tsai |
| 7,101,731 | B2 | 9/2006 | Karnezos |
| 7,119,427 | B2 | 10/2006 | Kim |
| 7,176,506 | B2 * | 2/2007 | Beroz et al. .................. 257/232 |
| 7,298,045 | B2 * | 11/2007 | Fujitani et al. ............... 257/724 |
| 7,372,141 | B2 * | 5/2008 | Karnezos et al. ............. 257/686 |
| 2002/0096755 | A1 | 7/2002 | Fukui et al. |
| 2002/0130404 | A1 | 9/2002 | Ushijima et al. |
| 2003/0113952 | A1 | 6/2003 | Sambasivam et al. |
| 2003/0153134 | A1 | 8/2003 | Kawata et al. |
| 2004/0016939 | A1 | 1/2004 | Akiba et al. |
| 2004/0061213 | A1 | 4/2004 | Karnezos |
| 2004/0201087 | A1 | 10/2004 | Lee |
| 2004/0212096 | A1 | 10/2004 | Wang |
| 2005/0051882 | A1 * | 3/2005 | Kwon et al. .................. 257/678 |
| 2006/0043556 | A1 | 3/2006 | Su et al. |
| 2006/0138631 | A1 | 6/2006 | Tao et al. |
| 2006/0189033 | A1 | 8/2006 | Kim |
| 2006/0197209 | A1 | 9/2006 | Choi et al. |

OTHER PUBLICATIONS

International Search Report and Written Opinion for corresponding International Application No. PCT/US06/16143 dated Apr. 27, 2007.
Kim, J. and Boruch, J., "Enabling a Microelectronic World™", AMKOR Technology, Inc. 2002 Annual Report, retrieved from Internet:<URL:http://media.corporate-ir.net/media_files/irol/11/115640/2002AnnualReport.pdf.

* cited by examiner

SEMICONDUCTOR ASSEMBLY INCLUDING CHIP SCALE PACKAGE AND SECOND SUBSTRATE WITH EXPOSED SURFACES ON UPPER AND LOWER SIDES

CROSS REFERENCE TO RELATED APPLICATIONS

This application is a Continuation-in-Part of U.S. application Ser. No. 11/306,628, filed Jan. 4, 2006, which claims priority from U.S. Provisional Application No. 60/667,277, filed Mar. 31, 2005, both titled "Encapsulant cavity integrated circuit package system", and both of which are assigned to STATS ChipPAC Ltd. This application also claims priority from U.S. Provisional Application No. 60/692,183, filed Jun. 20, 2005, titled "Semiconductor assembly including chip scale package and second substrate and having exposed substrate surfaces on upper and lower sides".

This application contains subject matter related to U.S. application Ser. No. 11/306,627; U.S. application Ser. No. 11/326,211; and U.S. application Ser. No. 11/326,206, each of which was filed Jan. 4, 2006, and all of which are assigned to STATS ChipPAC Ltd.

This application is related to U.S. application Ser. No. 11/395,529, by Marcos Karnezos et al., titled "Semiconductor stacked package assembly having exposed substrate surfaces on upper and lower sides"; and U.S. application Ser. No. 11/394,635, by Marcos Karnezos et al., titled "Semiconductor package including second substrate and having exposed substrate surfaces on upper and lower sides", both filed Mar. 31, 2006, and both assigned to STATS ChipPAC Ltd.

BACKGROUND

This invention relates to semiconductor packaging.

Portable electronic products such as mobile phones, mobile computing, and various consumer products require higher semiconductor functionality and performance in a limited footprint and minimal thickness and weight at the lowest cost. Mounting space may be limited, or at a premium, in devices such as in pagers, portable phones, and personal computers, among other products, and a large package footprint (x-y dimension) is undesirable. This has driven the industry to increase integration on the individual semiconductor chips, and also to implement integration on the "z-axis," that is, by stacking chips or by stacking die packages to form a stacked package assembly (stacked multi-package module).

Stacked package assemblies are employed in applications in which there is a need to provide a high degree of functional integration in an assembly having a minimal footprint and thickness. Portable telecommunications devices such as cellular telephones are an example of such applications, particularly where the telecommunications device includes, for example, capabilities for capture and display or play of images, audio or video.

Examples of functions that may desirably be integrated include devices for: various processes, including digital signal (DSP), ASIC, graphics (GPU); various memories, including Flash (NAND), Flash (NOR), SRAM, DRAM, MRAM; image and video capture, including optical sensor with memory; micro-electro-mechanical systems (MEMS) with processor and memory.

The z-interconnect between packages in a stacked package assembly is a critical technology from the standpoint of manufacturability, design flexibility and cost. Stacked package assemblies integrate chips and packages by stacking and electrically interconnecting them in the z-direction using wire bonds, or solder balls, or flip chip interconnection.

Stacked packages can provide numerous advantages. Particularly, each die or more than one die can be packaged in a respective package in the stack using the most efficient first level interconnect technology for the chip type and configuration, such as wire bonding or flip chip, to maximize performance and minimize cost.

It is desirable to be able to electrically test the stacked components (die or packages), so that the component can be rejected unless it shows satisfactory performance, before the packages are stacked. This permits maximizing the yield of the final stacked package assembly. To realize this advantage in practice, the packages must be configured to be testable using established test infrastructure. Generally, testing packaged die is preferable to testing individual die, as testing individual die can result in damage to interconnection pads on the die.

Often, the manufacturer of a product (particularly for example where the product is a portable communications device such as a cellular phone) determines the dimensions of a space in which the assembly must fit. That, is the manufacturer will demand that an assembly having specified functionalities have an overall footprint (length and width) and thickness within particular specifications. Presented with such limitations, the designer must, within cost limitations, be able to select packages and a stacking design and process that meet the demands for functionality within the limitations of thickness and footprint.

Accordingly, it is desirable to choose a multi-package stack structure and stacking process that provides design flexibility for the function designer. Particularly, for example, the designer should have flexibility, without having to redesign the structure or the process: to choose packages or chips from any of a variety of available vendors, to minimize component cost; to make changes in chip or package types within the assembly, to avoid having to re-qualify a changed assembly; and to complete the assembly stacking process at the final product stage on the surface mount assembly floor, to enable product configurations demanded by the market in the shortest practical time-to-market.

Meeting rapidly changing market demands can present challenges. For example, the general timeframe for designing a consumer device such as a cellular phone is typically longer than the timeframe for market shifts. A perception may develop in the industry that a particular functionality is desirable in a consumer device (e.g., web browsing functionality in a cellular phone), and designers may build that functionality into the assemblies; then within a short time it may become evident that the demand in the marketplace is not as had been perceived, and it may be desirable to remove that functionality or to present it in the marketplace as an option. Accordingly, it is desirable to be able to configure the device "on the fly", that is, to add or remove functionalities in a device without having to redesign the entire assembly.

It is desirable also to be able to stack off-the-shelf packaged chips, such as for example memory (Flash, SRAM, DRAM), over other packages in the assembly, using surface mount assembly methods employed in the industry for assembling products such as mobile communications devices (e.g., cellular phones) and computers. The type of memory for a product, in particular, can be different for different functionalities; for instance, if image capture functionality is desired in a cellular phone, a fast memory (DRAM) may be required.

The packages employed in stacked package assemblies and the manufacturing processes must be configured to enable both the physical stacking of the packages and the formation of electrical interconnections between them, using a chosen process for a chosen structure.

Stacked multi-package assemblies generally fall into two categories, namely, so-called "Package-on-Package" (PoP) assemblies, and so-called "Package-in-Package" (PiP) assemblies.

Examples of 2-stack PoP multi-package modules are shown for example in copending U.S. application Ser. No. 10/681,572, filed Oct. 8, 2003. In one example a first package (referred to as the "bottom" package) is similar to a standard BGA, having a die affixed to and electrically connected with the die attach side (the "upper" side) of a BGA substrate, and being cavity molded to provide a mold cap covering the die and electrical connections but leaving a marginal area of the die attach side of the substrate exposed. The side of the bottom package substrate opposite the die attach side (the "lower" side, which may be referred to as the "land" side) is provided with solder balls for second level interconnection of the module with underlying circuitry such as, for example, a motherboard. A second package (referred to as the "top" package) is stacked on the bottom package and is also similar to a standard BGA, except that the solder balls provided on the land side of the top package are arranged at the periphery of the top package substrate, so that they rest upon interconnection sites at the exposed marginal area of the die attach side of the bottom package. When the peripherally arranged balls are contacted with and then reflowed onto the peripherally located interconnect sites at the bottom package, they effect the z-interconnection without interference with the mold cap of the bottom BGA. The top package die and electrical connections are also encapsulated.

The type of z-interconnect employed in the PoP module requires that the top and bottom package substrates be designed with matching pads for the z-interconnect balls. If one of the packages is exchanged for one in which the substrate has a different pad arrangement (different size or different design), then the substrate for the other package must be reconfigured accordingly. This leads to increased cost for manufacture of the multi-package module. In the PoP configuration the distance between the top and bottom packages must be at least as great as the encapsulation height of the bottom package, which may be 0.25 mm or more, and typically is in a range between 0.5 mm and 1.5 mm, depending upon the number of die and depending upon whether the die-to-substrate electrical connection is by flip chip or by wire bonds. For example, for a single wire bonded die in the bottom package a moldcap of 300 um can typically accommodate a 75 um thick die. The z-interconnect solder balls must accordingly be of a sufficiently large diameter that when they are reflowed they make good contact with the bonding pads of the bottom BGA, without contact between the land side of the top package substrate and the upper surface of the bottom package mold cap; that is, the solder ball diameter must be greater than the encapsulation height by an amount that allows for solder ball collapse during reflow, plus a tolerance for noncoplanarities between balls and substrate. A typical design difference (additional clearance) between collapsed ball height and bottom mold cap height is about 25 um. For a moldcap having a thickness about 300 um, for example, z-interconnect solder balls greater than 300 um must be employed. A larger ball diameter dictates a larger ball pitch (typically about 0.65 mm pitch for 300 um balls, for example). That in turn limits the number of balls that can be fitted in the available space in the periphery of the bottom package substrate. Furthermore the peripheral arrangement of the solder balls forces the bottom BGA to be significantly larger than the mold cap of a standard BGA. And the peripheral arrangement of the solder balls increases the overall package size (the size increases according to the number of ball rows and the ball pitch). In standard BGAs the body size can be as much as about 2-3 mm larger than the mold cap. Moreover, the top package in a PoP configuration must be made of comparable size to the bottom one even though it may contain a small chip with many fewer interconnects. Increasing package footprint, to provide greater area for ball attachment (additional rows of balls, for example), may exceed the size limits for the particular application, and in any event entails longer wire bond spans and greater substrate area, both of which increase the cost of these components. Increasing the numbers of interconnections between packages may require that the top package substrate have at least two metal layers (and often more than two) to facilitate the routing within the substrate electrical connections. It may in some applications be impractical in a PoP configuration to stack two die in the bottom package, as this causes the bottom mold cap to be even thicker, exacerbating the problems described above.

Examples of two-stack PiP modules, having z-interconnection by wire bonds between the upward-facing sides of the top and bottom package substrates, are disclosed for example in copending U.S. application Ser. No. 10/632,549, filed Aug. 2, 2003, and copending U.S. application Ser. No. 10/681,572, filed Oct. 8, 2003. In the PiP configuration, the top package may be either oriented in the same direction as the bottom package (that is, with the die attach sides of both package substrates facing the same direction); or the top package may be inverted with respect to the bottom package (that is, with the die attach sides of the respective package substrates facing one another). Second-level interconnect solder balls are provided on the land side of the bottom package substrate for connection of the module with underlying circuitry such as, for example, a motherboard. In configurations where the top package is inverted, the z-interconnection wire bonds connect wire bond sites at the land side of the top substrate with peripherally arranged wire bond sites on the die attach side of the bottom package substrate. Where the top and bottom packages are oriented the same way, the z-interconnection wire bonds connect peripherally arranged wire bond sites at the die attach side of the top substrate with peripherally arranged wire bond sites at the die attach side of the bottom package substrate. In both configurations, the top package must be smaller (narrower and/or shorter by at least 0.5 mm on each margin that has z-interconnections) than the bottom package to accommodate the wire bond process.

The PoP module or PiP module is completed by overmolding, to entirely cover the top package and the wire bond interconnects between the packages. Once the module has been overmolded, no further integration can be made. That is, the designer has no flexibility to reconfigure the assembly at the product assembly level (that is, at the surface mount assembly floor); and the original equipment manufacturer cannot mix-and-match various packages from various suppliers to reduce costs.

SUMMARY

This invention is directed to semiconductor assemblies, having a first package including die and substrate, and having a second substrate stacked over the first package. The first package includes at least one die affixed to, and electrically interconnected with, a die attach side of the first package substrate. The side of the first package substrate opposite the die attach side may be referred to as the "land" side of the substrate. The second substrate, which may be a LGA substrate, has a first side facing the die attach side of the first package substrate, and a second side (which may be referred to as the "land" side of the second substrate) facing away from the die attach side of the first package substrate. Accordingly, the "land" sides of the substrates face away from one another. Z-interconnection of the first package and the second substrate is by wire bonds connecting the first package substrate and the second substrate.

Generally according to the invention, the assembly is encapsulated in such a way that both the second substrate (at one side of the assembly) and a portion of the first package substrate (at the opposite side of the assembly) are exposed, so that second level interconnection and interconnection with additional components may be made.

According to one aspect of the invention, the first package is a chip scale package (CSP), such as a matrix molded and saw singulated CSP. Z-interconnection between the first package and the second substrate is by wire bonds between wire bond sites in a marginal area on the land side of the CSP and peripherally located wire bond sites in a marginal area on the first side of the second substrate. The second substrate is larger (i.e., wider or longer, or both wider and longer) than the CSP package substrate, to accommodate the span of the wire bonds. The assembly encapsulation covers the marginal area of the first side of the second substrate, and encloses the z-interconnection wire bonds and wire loops, the edges of the CSP, and the marginal area on the land side of the CSP. Accordingly, both the land side of the second substrate, and the area of the land side of the CSP substrate located within the marginal area, are left exposed.

In some embodiments the CSP is a stacked die CSP. In some embodiments the die in the CSP is interconnected with the CSP substrate by wire bonding; or, the die in the CSP is interconnected with the CSP substrate by flip chip interconnection.

In one general aspect of the invention the CSP side of the assembly is the second level interconnect side; that is, second level interconnection of the assembly to underlying circuitry (such as, for example, a motherboard) is by solder balls (or other means of electrical connection) at lands on the exposed area on the land side of the CSP substrate. The exposed land side of the second substrate is, accordingly, available for interconnection with additional components that may be stacked over the assembly. In further aspects, then, the invention features a semiconductor assembly that has both a second substrate exposed at one side of the assembly and a portion of a CSP package substrate exposed at the opposite side of the assembly, and that includes second level interconnection formed at the exposed portion of the CSP package substrate and interconnection with one or more additional components at the exposed second package substrate. In some embodiments the additional component includes one or more of: a ball grid array (BGA) package, which may be a stacked die BGA; or an LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices. In some embodiments a heat spreader is mounted over the exposed land side of the second substrate.

In another general aspect of the invention the LGA substrate side of the assembly is the second level interconnect side; that is, second level interconnection of the assembly to underlying circuitry (such as, for example, a motherboard) is by solder balls (or other means of electrical connection) at lands on the exposed area on the land side of the LGA substrate. The exposed land side of the CSP substrate is, accordingly, available for interconnection with additional components that may be stacked over the assembly. In further aspects, then, the invention features a semiconductor assembly that has both a second substrate exposed at one side of the assembly and a portion of a CSP package substrate exposed at the opposite side of the assembly, and that includes second level interconnection formed at the exposed portion of the LGA package substrate and interconnection with one or more additional components at the exposed CSP package substrate. In some embodiments the additional component includes one or more of: a ball grid array (BGA) package, which may be a stacked die BGA; or an LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices. In some embodiments a heat spreader is mounted over the exposed land side of the LGA package.

According to another aspect of the invention, a method for making a semiconductor assembly includes steps of: providing a singulated CSP, preferably tested as "good"; applying an adhesive onto the surface of the mold cap of the "good" CSP; providing a second substrate; inverting the "good" CSP and placing the inverted CSP onto a first side of the second substrate, with the adhesive contacting the first side of the substrate; curing the adhesive; performing a plasma clean; wire bonding to form z-interconnection between the first side of the second substrate and the land side of the CSP; performing a plasma clean; performing a molding operation to enclose the first side of the substrate, the z-interconnection wire bonds and wire loops, the edges of the CSP, and the marginal area on the land side of the CSP, leaving exposed the second ("land") side of the second substrate and an area of the land side of the CSP substrate located within a marginal area; attaching second level interconnect solder balls to sites on the exposed area of the CSP substrate; and (where the second substrate was provided in a strip or array) saw singulating to complete a unit assembly.

In some embodiments the method further includes affixing and electrically connecting an additional component at the exposed land side of the second substrate. An additional component or components can be mounted upon the assembly as a further step in the manufacture of the stacked package assembly; or, an additional component or components can be mounted upon the assembly at the final product assembly floor.

According to another aspect of the invention, a method for making a semiconductor assembly includes steps of: providing a singulated CSP, preferably tested as "good"; applying an adhesive onto the surface of the mold cap of the "good" CSP; providing a second substrate; inverting the "good" CSP and placing the inverted CSP onto a first side of the second substrate, with the adhesive contacting the first side of the substrate; curing the adhesive; performing a plasma clean; wire bonding to form z-interconnection between the first side of the second substrate and the land side of the CSP; performing a plasma clean; performing a molding operation to enclose the first side of the substrate, the z-interconnection wire bonds and wire loops, the edges of the CSP, and the marginal area on the land side of the CSP, leaving exposed the second ("land") side of the second substrate and an area of the land side of the CSP substrate located within a marginal area; attaching second level interconnect solder balls to sites on the exposed land side of the second (LGA) substrate; and (where the second substrate was provided in a strip or array) saw singulating to complete a unit assembly.

In some embodiments the method further includes affixing and electrically connecting an additional component at the exposed land side of the second substrate. An additional component or components can be mounted upon the assembly as a further step in the manufacture of the stacked package assembly; or, an additional component or components can be mounted upon the assembly at the final product assembly floor.

In the assembly according to the invention the second substrate can include any of a variety of substrates, so long as the second substrate has wire bond sites exposed at the first side for z-interconnection, and sites exposed at the land side for assembly testing and/or for interconnection of additional components. The assembly can include any of a variety of LGA substrates; the assembly can include wire bonded and/or flip chip packages; the assembly can include a thermal enhancement feature enabled by one or more heat spreaders in or on the assembly; the assembly can include one or more BGA and/or LGA having more than one die in the package stacked or side by side; the assembly can include electromagnetic shield for one or more of the packages; and the assembly can include any substrate, laminate or build-up or flexible or ceramic, provided that the z-interconnect pads are made available for bonding on peripheral areas of the first package and of the second substrate.

The invention provides for excellent manufacturability, high design flexibility, and low cost to produce a stacked package module having a low profile and a small footprint.

The CSPs and substrates are standard in the industry, providing for selection of the lowest cost and the widest availability. This provides significant flexibility in selecting the packages to be stacked and, therefore, in the kinds of functions that can be integrated into the assembly.

A typical single wire-bonded die CSP thickness is 0.8 mm. The stacking of a second substrate on top of a CSP according to the invention can be completed using an adhesive having a finished thickness in the range 10-50 microns. This structure provides a widely useful platform for stacking additional components (packages or die or passive devices). The footprint of the assembly according to the invention can be determined according to the maximum chip size of the stack. The wire bond z-interconnect generally requires that the bottom CSP be smaller than the second substrate, by about 0.5 mm to 1.0 mm, to accommodate the wires without shorting to the substrate metal edges. If the selected bottom CSP package is significantly smaller than the top substrate, wire bonding can accommodate size differences at least up to 8 mm or more. For a given selected CSP, accordingly, this allows for selection of a top substrate having a significantly larger footprint than the CSP. This provides significant flexibility for the designer, to choose additional components to be stacked over the assembly.

Package assemblies according to the invention can be used for building computers, telecommunications equipment, and consumer and industrial electronics devices.

DETAILED DESCRIPTION

Figure 1:
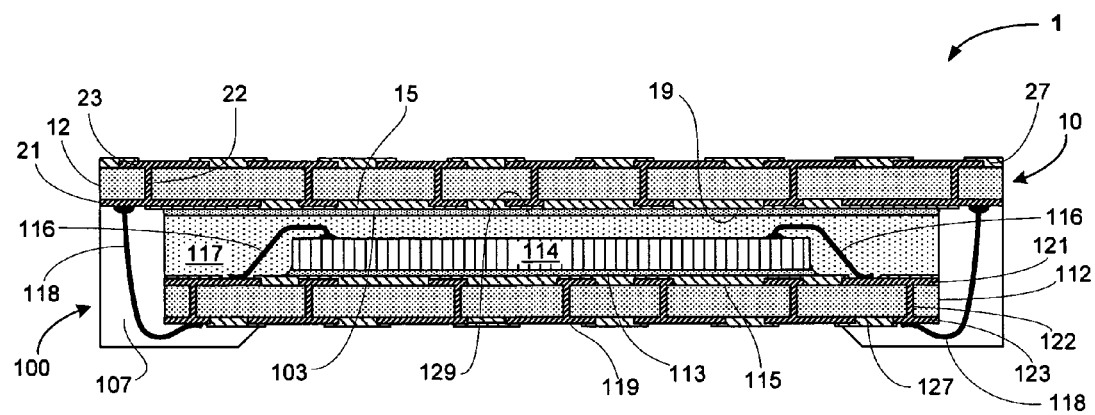
FIG. 1 is a diagrammatic sketch in a sectional view thru an embodiment of a semiconductor assembly according to an aspect of the invention.

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly relabeled, although they are all readily identifiable in all the FIGs.

At some points herein, terms of relative orientation, such as "horizontal", "vertical", "on", "over", "under", "above", "below", "top", "bottom", "upper", "lower", and the like, may be used with reference to the relative orientation of features as shown in the drawings. As will be appreciated, the various assemblies according to the invention may in use or during processing be held in any orientation.

All patents and patent applications referred to herein, above or below, are incorporated by reference.

Turning now to FIG. 1, there is shown in a diagrammatic sectional view generally at 1 an embodiment of a semiconductor assembly, including a first ("bottom") package and a second ("top") substrate stacked over the first package, in which the package and the second substrate are interconnected by wire bonding, according to an aspect of the invention. In the embodiment shown in FIG. 1, the bottom package 100 is a conventional chip scale package ("CSP"). Accordingly, in this embodiment the bottom package 100 includes a die 114 attached onto a bottom package substrate 112 having at least one metal layer (which may be referred to as an "interposer"). Any of various substrate types may be used, including for example: a laminate with 2-6 metal layers, or a build up substrate with 4-8 metal layers, or a flexible polyimide tape with 1-2 metal layers, or a ceramic multilayer substrate. The bottom package substrate 112 shown by way of example in FIG. 1 has two metal layers 121, 123, each patterned to provide appropriate circuitry and connected by way of vias 122. The die is conventionally attached to a surface of the substrate using an adhesive, typically referred to as the die attach epoxy, shown at 113 in FIG. 1 and, in the configuration in FIG. 1, the side of the substrate onto which the die is attached (the "die attach" side) may be referred to as the "upper" side, and the metal layer on that side may be referred to as the "upper" metal layer, although the die attach side need not have any particular orientation in use.

In the first CSP package of FIG. 1 the die is wire bonded onto wire bond sites on the upper metal layer of the substrate to establish electrical connections. The die 114 and the wire bonds 116 are encapsulated, by matrix molding and saw singulation, with a molding compound 117 that provides protection from ambient and from mechanical stress to facilitate handling operations, and provides a first package upper surface 129 onto which the second substrate can be stacked. Bonding pads 119 are provided on the lower metal layer 123 of the substrate 112, for second level interconnection of the assembly to the underlying circuitry of, for example, a motherboard (not shown in the FIGs.). Solder masks 115, 127 are patterned over the metal layers 121, 123 to expose the underlying metal at bonding sites for electrical connection, for example the wire bond sites and bonding pads for bonding the wire bonds 116 and solder balls 118.

Referring still to FIG. 1, the second ("top") substrate 10 having a first side and a second side, including a substrate dielectric 12 and at least one metal layer. Any of various substrate types may be used; the substrate 10 shown by way of example in FIG. 1 has two metal layers 21, 23, each patterned to provide appropriate circuitry and connected by way of vias 22. The side of the second substrate that faces the first package is the assembly is referred to as the first side, and the opposite side—the second side or "land" side—faces away from the first package in the assembly.

In the second substrate 10 in the embodiment of FIG. 1 solder masks 15, 27 are patterned over the metal layers 21, 23 to expose the underlying metal at bonding sites for electrical connection, for example the wire bond sites for bonding the wire bonds 118.

The z-interconnect top substrate 10 and first package 100 is made by way of wire bonds 118 connecting traces on the downward facing metal layer (the metal layer 21) of the top substrate with traces on the lower metal layer 123 of the first package substrate. At one end each wire bond 118 is electrically connected to downward facing surfaces of pads on the metal layer 21 of the top substrate 12, and at the other end each wire bond is connected to lower surfaces of pads on the lower metal layer 123 of the first package substrate 112. The wire bonds may be formed by any wire bonding technique, well known in the art, such as is described, for example, in U.S. Pat. No. 5,226,582, which is hereby incorporated by reference herein. The package-to-package z-interconnect wire bonds are shown by way of example in FIG. 1 as having been made by forming a bead or bump on the surface of a pad on the lower metal layer of the top substrate, and then drawing the wire toward, and fusing it onto, a pad on the lower metal layer of the first package substrate. As will be appreciated, the wire bonds can be made in the inverse direction, that is, by forming a bead or bump on the lower surface of a pad on the lower metal layer of the first substrate, and then drawing the wire toward, and fusing it onto, a pad on the metal layer of the second substrate. As will be appreciated, selection of a wire bonding strategy for the package-to-package z-interconnection will be determined according to the geometric arrangements of the margins of the stacked substrates and of the bonding surfaces on them. Also, as will be appreciated, in conventional wire bonding equipment the wire bond capillary strikes downward onto upwardly oriented bond pads and, accordingly, the assembly will be inverted according to the invention for the wire bonding procedure at least.

As pointed out above, the second (top) substrate is larger than the surface of the first package mold cap on which it is mounted, leaving an area at the periphery of the first side of the top package substrate on which the bond pads are exposed for the wire bonds 118. The top substrate is (typically later) punch- or saw-singulated.

The first package, is (in the example shown in FIG. 1) matrix molded and saw singulated (to provide vertical walls for the molding, as shown in FIG. 1), so that the die attach side of the bottom package substrate is covered by the molding. Bond pads in the upper metal layer at the die attach side of the bottom package substrate are connected to the die by wire bonds, and the upper metal layer is connected to the lower metal layer at the land side of the bottom package substrate through vias to the die attach side of the substrate, and the lower metal layer at the land side of the bottom package substrate is patterned to provide peripherally arranged bond pads for connection with the z-interconnection wires 118.

The structure according to the invention allows for pre-testing of the CSP before assembly into the assembly, to permit rejection of nonconforming packages prior to assembly, and thereby to assure high final module test yields.

In the stacked package embodiment of FIG. 1, the z-interconnect pads on the respective substrates are arranged on metal layers near the margins of the substrates. The location and order of the z-interconnect pads are generally arranged so that the z-interconnect pads on the top package substrate approximately overlie the corresponding z-interconnect pads on the bottom package when the packages are stacked. Conveniently, the second (top) substrate 10 has a larger substrate footprint than that of the first (bottom) package 100, to allow clearance for the wire bonds without electrical shorting to the edges of the metal layers of the substrates.

Once the z-interconnect wire bonds have been formed connecting the stacked first package and the second substrate, an assembly encapsulation 107 is formed, to enclose and protect the z-interconnect wire bonds and to provide mechanical integrity to the completed assembly. The assembly encapsulation 107 covers the marginal area of the downward-facing first side of the second substrate, and encloses the z-interconnection wire bonds and wire loops and the vertical walls and edges of the bottom package, and covers the marginal area of the land side of the bottom package substrate including the wire loops and the wire bond pads to which the wire bonds are connected. This leaves an area of the land side of the bottom package substrate exposed for second-level interconnection.

Figure 3:
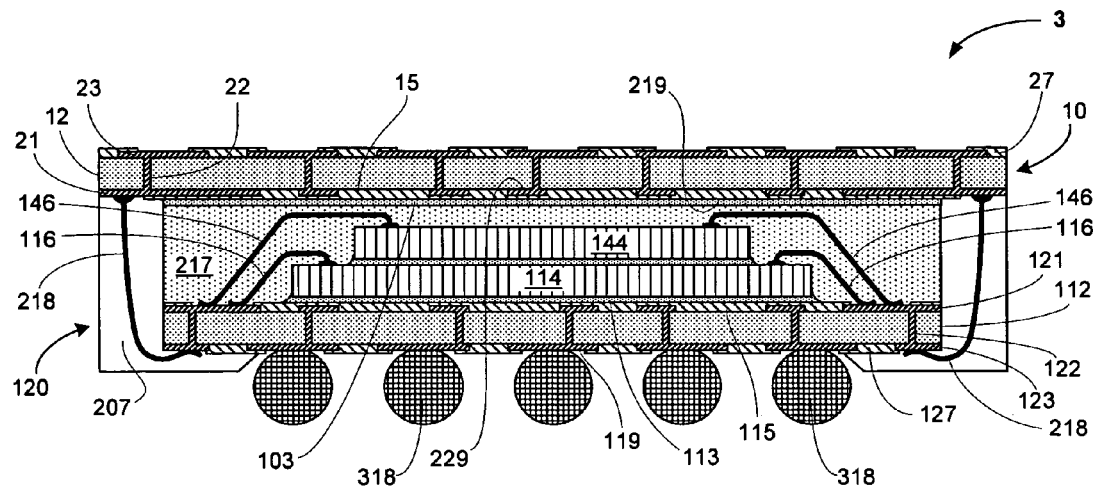
FIG. 3 is a diagrammatic sketch in a sectional view thru an embodiment of a semiconductor assembly according to another aspect of the invention.

Referring to FIG. 3, solder balls 318 are reflowed onto bonding pads 119 on the lower metal layer of the substrate to provide interconnection to underlying circuitry of, for example, a motherboard (not shown in the FIGS.) of a final product, such as a computer.

As shown by way of example in FIGS. 1 and 3, the assembly may itself be saw-singulated; alternatively, the module may be individually molded rather than saw-singulated.

As may be appreciated, the first package may have flip chip, rather than wire bonding, interconnection of the die to the first package substrate.

Figure 2:
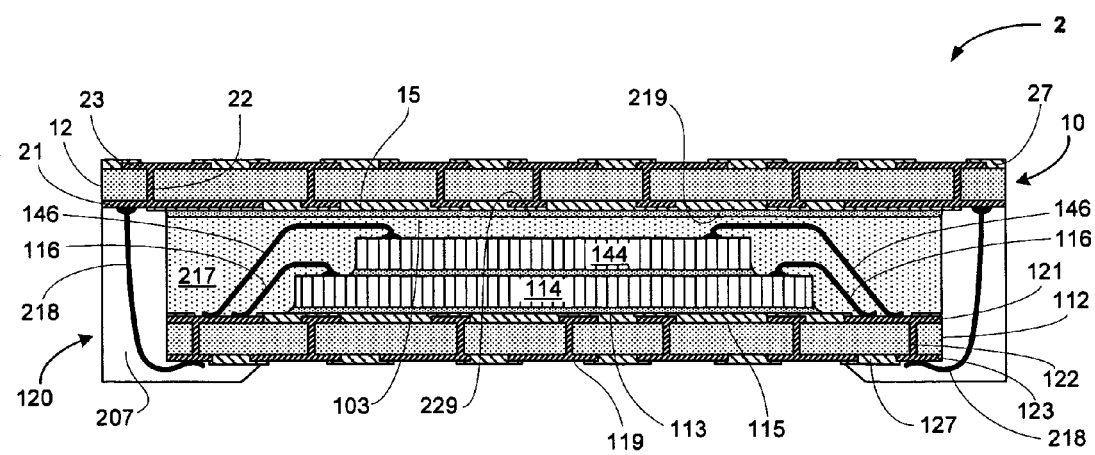
FIG. 2 is a diagrammatic sketch in a sectional view thru an embodiment of a semiconductor assembly according to another aspect of the invention.

The first package may be a stacked die package. FIG. 2 shows, by way of example, a semiconductor assembly 2 generally as in FIG. 1, except that in the example of FIG. 2 the bottom package is a stacked die package, having two wire bonded die. Referring now to FIG. 2, a bottom package 120 is a conventional two-die stacked die CSP. In package 120 a first die is 114 attached using an adhesive to the (upward facing in the FIG.) die attach side of substrate 112 and a second die 144 is attached using an adhesive to the (upward facing) die attach side of the first die 114. The first die 114 and the second die 144 are electrically connected by wire bonds 116, 146, respectively, to bond sites in the upper metal layer 121. The die 114, 144 and the wire bonds 116, 146 are encapsulated, in this example by matrix molding and saw singulation, with a molding compound 217, that provides protection from ambient and from mechanical stress to facilitate handling operations, and provides a bottom package upper surface 229 onto which a second substrate can be stacked.

In the example of FIG. 2, the second substrate 10 is substantially the same as the second substrate 10 of FIG. 1. In the stacked package assembly 2 the second substrate 10 is affixed over first package 120 using an adhesive 103 between the mated upper surface 229 of the first package molding or mold caps, and the downward facing surface 19 of the second substrate. The z-interconnection wire bonds 218 are formed. Once the z-interconnect wire bonds have been formed connecting the stacked first and second packages, an assembly encapsulation 207 is formed, to enclose and protect the z-interconnect wire bonds and to provide mechanical integrity to the completed assembly. The assembly encapsulation 207 covers the marginal area of the downward-facing first side of the second substrate, and encloses the z-interconnection wire bonds and wire loops and the vertical walls and edges of the bottom package, and covers the marginal area of the land side of the bottom package substrate including the wire loops and the wire bond pads to which the wire bonds are connected. This leaves an area of the land side of the bottom package substrate exposed for second-level interconnection. Solder balls are reflowed onto bonding pads 119 on the lower metal layer of the exposed lower package substrate to provide interconnection to underlying circuitry of, for example, a motherboard (not shown in the FIGS.) of a final product, such as a computer, as shown by way of example in FIG. 3.

In an alternative embodiment, the exposed side of the second substrate provides for second-level interconnection. By way of example, the embodiment shown in FIG. 4 has second level interconnect solder balls 418 mounted onto pads 419 on the metal layer 23, for connection of the assembly to underlying circuitry such as a motherboard. In embodiments such as these, the exposed portion of the first package substrate is available for stacking additional components such as packages, die, or passive devices. However, the exposed portion of the first package substrate has a more limited area than the second package substrate, limiting the number of interconnections that can be made at the first package side. Moreover, the part of the assembly molding 207 that covers the marginal area of the land side of the land side of the first package substrate must be thick enough to accommodate the loop height of the wire bonds 118 (plus a tolerance). Typically the thickness of the molding at the wire loops is in the range about 50 um to about 200 um. Where reverse wire bonding is employed, so that an end of the wire loop is stitched onto the pads on the land side of the first package, the wire loop height in practice may be as little as about 35 um and, accordingly, a molding thickness over the marginal area of as little as about 100 um can be achieved in such embodiments. A greater mold height will be required where forward wire bonding is employed, as the wire loop height over a ball (or bump) as more usually about 100 um or greater using currently available wire bonding techniques forming wire having about 1 mil thickness.

This in effect raises a low wall around the exposed region of the first package substrate, and this can limit the dimensions and configuration of devices that may be stacked upon the land side of the first package substrate. Embodiments as shown for example in FIG. 3, in which the second level interconnection is made at the exposed region of the land side of the first package substrate, permit stacking of much larger additional components over the assembly, as shown in FIGS. 7B and 8B, for example.

Figure 4:
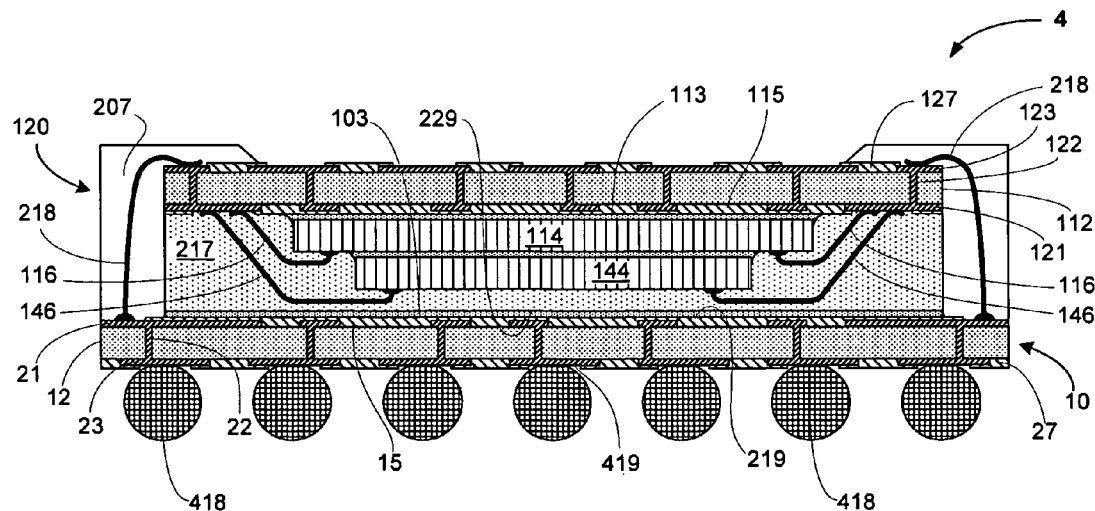
FIG. 4 is a diagrammatic sketch in a sectional view thru an embodiment of a semiconductor assembly according to another aspect of the invention.
Figure 16:
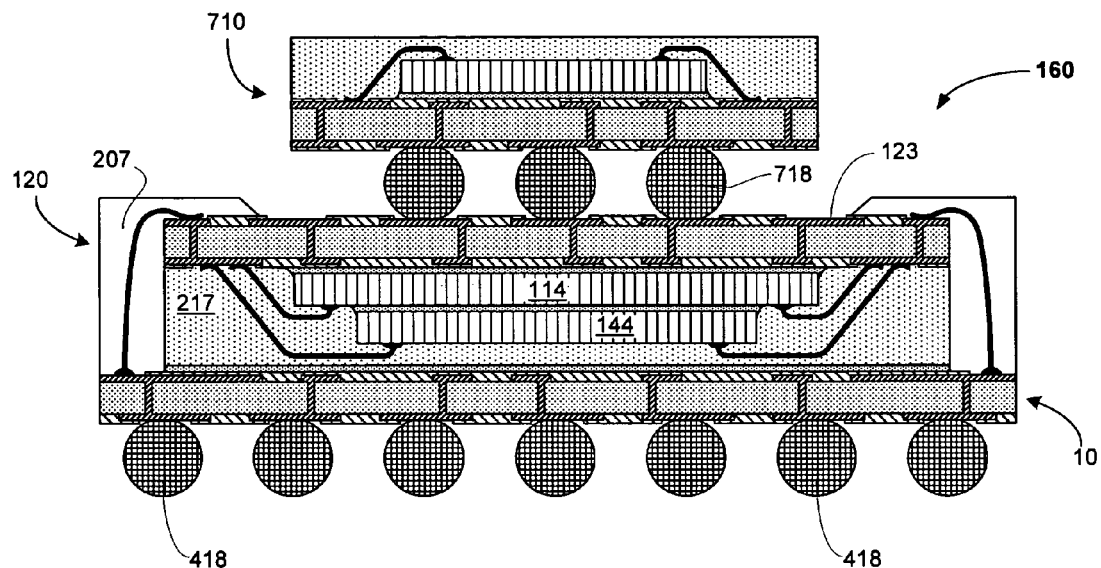
FIG. 16 is a diagrammatic sketch in a sectional view thru a stacked package assembly according to an embodiment of the invention, including a BGA stacked over an assembly according to an embodiment of the invention as shown in FIG. 4.
Figure 17:
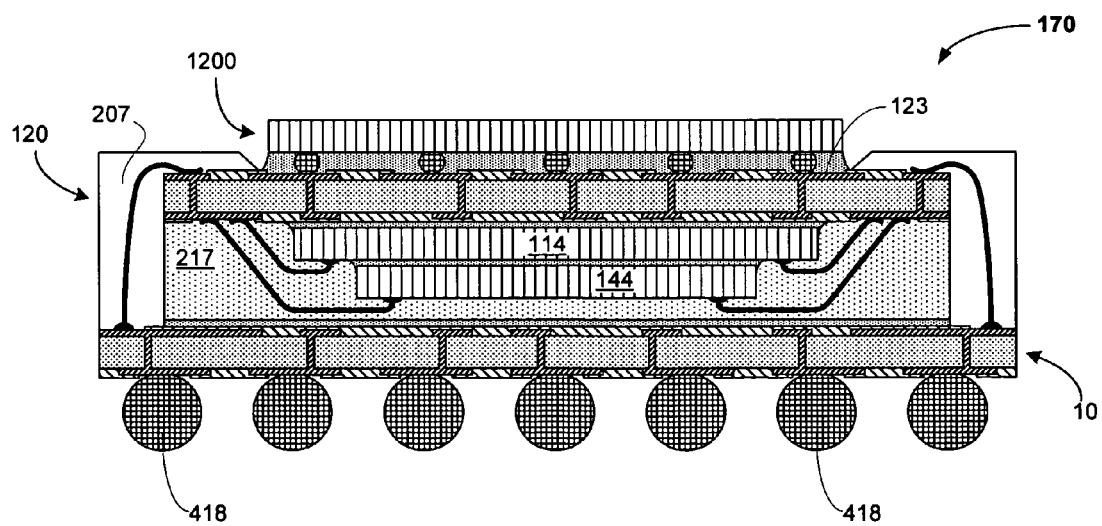
FIG. 17 is a diagrammatic sketch in a sectional view thru a stacked package assembly according to an embodiment of the invention, including a flip chip die mounted over an assembly according to an embodiment of the invention as shown in FIG. 4.

Embodiments as shown for example in FIG. 4, in which the second level interconnection is made at the land side of the second package substrate, are shown in FIGS. 16 and 17, for example. As described in further detail below, one or more additional components can be mounted upon and electrically connected with, the land side of the first package substrate within the cavity in the encapsulation.

Figure 5A:
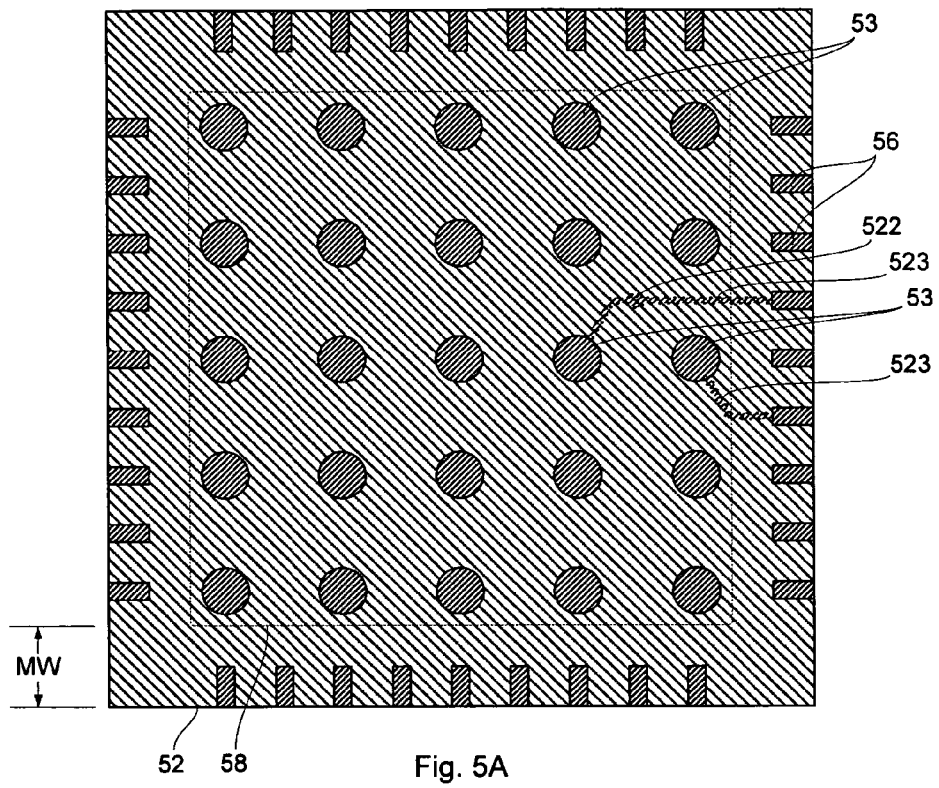
FIG. 5A is a diagrammatic sketch in a plan view showing the land side of a CSP substrate according to an embodiment of the invention in an arrangement suitable for use in an embodiment of the invention as shown in FIG. 3.
Figure 5B:
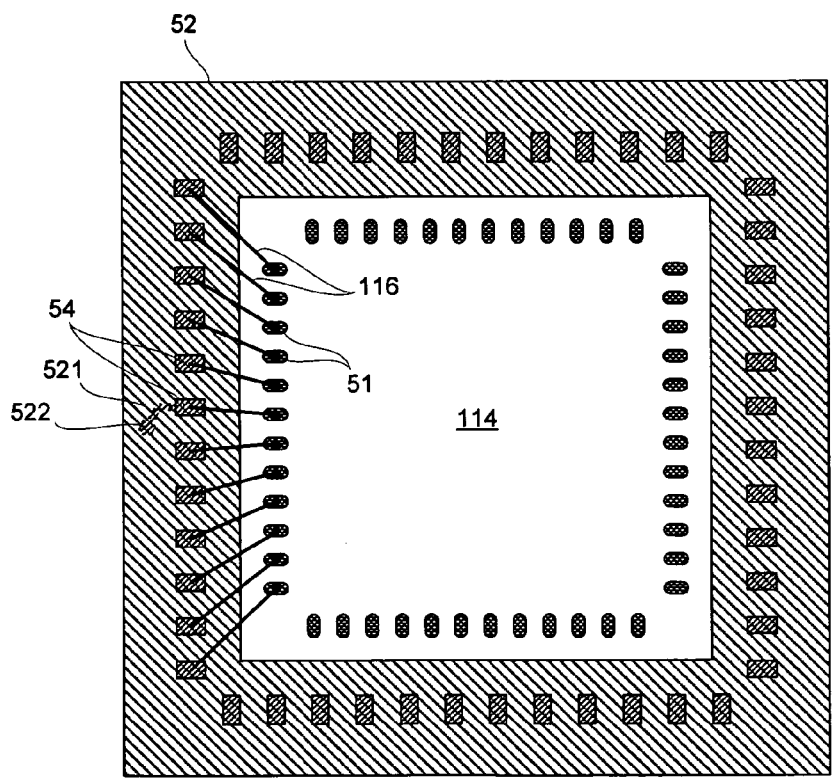
FIG. 5B is a diagrammatic sketch in a plan view showing the die attach side, with die attached, of a CSP substrate according to an embodiment of the invention in an arrangement suitable for use in an embodiment of the invention as shown in FIG. 3.

FIGS. 5A and 5B are diagrammatic sketches in plan view showing the land side and the die attach side, respectively, of a suitable first package substrate as illustrated at 112 in FIG. 1. Referring to FIG. 5A, most of the surface of the land side is covered by the solder mask, which obscures the patterned metal layer beneath except where sites on the metal layer are revealed by openings in the solder mask. Openings in the solder mask reveal sites in the patterned metal layer at the land side of the substrate, including ball pads (e.g., 53) arrayed in a middle region of the substrate surface, and bond fingers (e.g., 56), arranged in a marginal area near the edge 52 of the substrate. Obscured by the solder mask are traces (e.g., 523) in the metal layer which variously connect the ball pads 53 and the bond fingers 56, and/or connect ball pads 53 with vias (e.g., 522) which electrically connect traces in the patterned metal layer at the land side of the substrate with traces in the patterned metal layer at the die attach side of the substrate.

As described above, the assembly encapsulation covers the bond pads 56 and the wire loops formed at the pads 56; the encapsulation is limited at the land side of the substrate to a marginal area, indicated in FIG. 5A by the broken line 58, so the region of the land side of the first package substrate bounded by the marginal encapsulation, that is, within the broken line 58, is left exposed following formation of the assembly molding. Accordingly, the ball pads 53 are available for attachment of additional devices (as illustrated for example in FIG. 4) or, more preferably, for z-level interconnection of the assembly to underlying circuitry (as illustrated for example in FIG. 3). The ball pads 53 are additionally available as test probe sites for testing the package prior to assembly, or for testing the package assembly, if desired, prior to mounting the second level interconnect solder balls. The encapsulated marginal area has a width (MW in FIG. 5A) determined by the sum of the lengths of the bond fingers, the length of the trace to the bond finger, and the width of the saw street. Additionally, some mold flash may appear on the substrate surface at the inner edge of the margin (at the broken line 58 in FIG. 5A). Where the substrate is provided as one in a strip or array, some substrate material at the edge is lost to the saw width during saw singulation of the first package. Typically the bond finger length is about 250 um, the finger trace length is about 50 um, and an allowance for mold resin bleed can be about 500 um. The saw typically consumes about 50 um.

As a practical matter the number and arrangement of the ball pads 53 depend upon the nominal ball diameter, as the balls must not contact each other, or be too close together, when collapsed. Also as a practical matter the size and proximity of the ball pads 53 are limited by limits of resolution in fabricating the traces and, particularly, the solder mask openings. In a typical example the ball pads are generally circular with a diameter about 280 um, and are arranged in a square or rectangular array at a center-to-center distance about 500 um. (The distance between nearest edges of adjacent solder mask openings is typically not less than about 0.20 times the center-to-center distance.)

The die attach side of the first package substrate, with die attached, is illustrated in FIG. 5B. The die 114 is affixed, active side upward, onto the die attach side of the substrate. In this example, the die has four edges defining a square. Wire bond pads 51 are arranged in rows near the four edges of the die. As on the land side of the substrate, most of the surface of the die attach side is covered by a solder mask, except where sites on the metal layer are revealed by openings in the solder mask, including particularly rows (one row along each edge of the die, in this example) of bond fingers (e.g., 54). Wires 116 connect the die pads 51 with the bond fingers 54. Obscured by the solder mask are traces (e.g., 521) in the metal layer connecting bond fingers 54 to vias (e.g., 522) which electrically connect traces in the patterned metal layer at the die attach side of the substrate with traces in the patterned metal layer at the land side. Accordingly, the first package die is connected by way of the wires to traces in the metal layer on the die attach side of the first package substrate, and by way of vias to traces and to z-interconnect wire bond fingers in the metal layer on the land side. The z-interconnect wires connect the bond fingers on the land side of the first package substrate to bond fingers on the die attach side of the second package substrate.

Figure 6A:
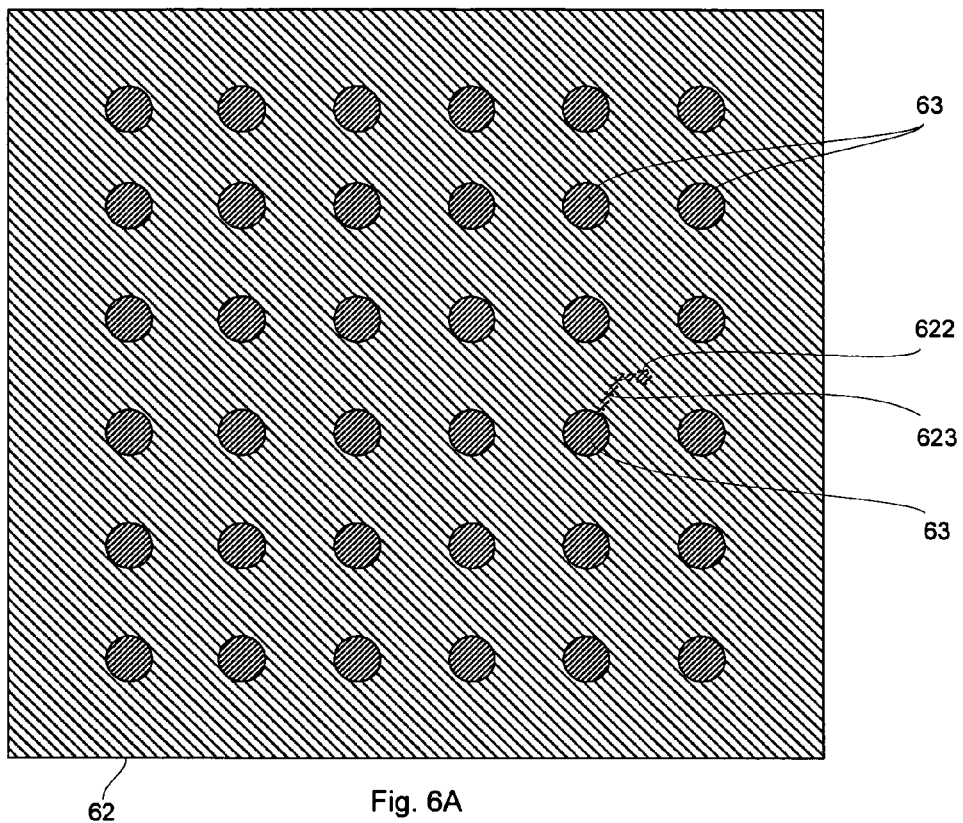
FIG. 6A is a diagrammatic sketch in a plan view showing the land side of a second substrate according to an embodiment of the invention in an arrangement suitable for use in an embodiment of the invention as shown in FIG. 3.
Figure 6B:
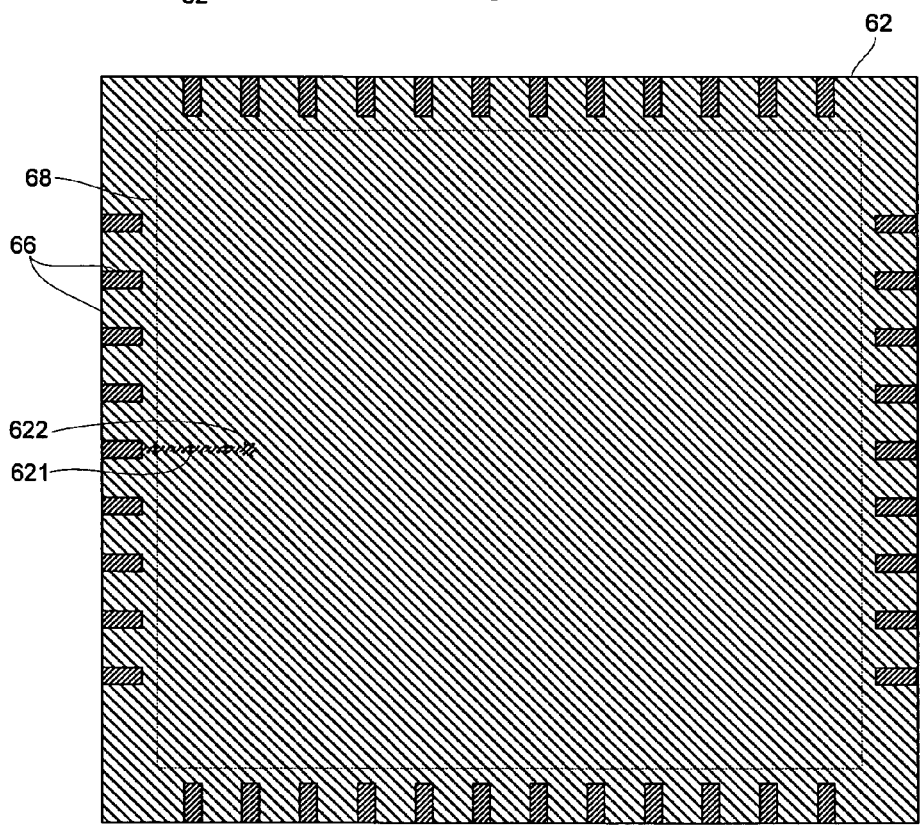
FIG. 6B is a diagrammatic sketch in a plan view showing the first side of a second substrate according to an embodiment of the invention in an arrangement suitable for use in an embodiment of the invention as shown in FIG. 3.

FIGS. 6A and 6B are diagrammatic sketches in plan view showing the second side and the first side, respectively, of a suitable second substrate as illustrated at 10 in FIG. 1. Referring to FIG. 6A, most of the surface of the land side is covered by the solder mask, which obscures the patterned metal layer beneath except where sites on the metal layer are revealed by openings in the solder mask. Openings in the solder mask reveal sites in the patterned metal layer at the land side of the substrate, including ball pads (e.g., 63) arrayed in a middle region of the substrate surface. Obscured by the solder mask are traces (e.g., 623) in the metal layer which connect the ball pads 63 to vias (e.g., 622) which electrically connect traces in the patterned metal layer at the land side of the substrate with traces in the patterned metal layer at the first side of the substrate.

As described above, land side of the second substrate is left entirely exposed following assembly encapsulation. Accordingly, the view of the second substrate in FIG. 6A is substantially a view of a surface of the assembly. Accordingly, the ball pads 63 are available for z-level interconnection of the assembly to underlying circuitry (as illustrated for example in FIG. 4) or, more preferably, for attachment of additional devices (as illustrated for example in FIG. 3). The ball pads 63 are additionally available as test probe sites for testing the package prior to assembly, and for testing the package assembly, if desired, prior to mounting the second level interconnect solder balls.

Optionally, and in some applications preferably, the ball attach pads on the land side of the second substrate may be employed to facilitate testing of the assembly using a conventional test socket. Such testing of the assembly can be carried out, for example, following attachment of the second substrate as a top substrate, but prior to formation of the overall assembly molding, or prior to z-interconnect wire-bonding. Testing, facilitated according to the constructs of the invention, at any of various stages in manufacture, can significantly reduce the likelihood of further processing of components that do not meet specifications.

The die attach side of the second substrate is illustrated in FIG. 6B. As on the land side of the second substrate, most of the surface of the first side is covered by a solder mask, except where sites on the metal layer are revealed by openings in the solder mask, including particularly z-interconnect bond fingers (e.g., 66) arranged in a marginal area near the edge 62 of the substrate. Obscured by the solder mask are traces (e.g., 621) in the metal layer connecting vias (e.g., 622) which electrically connect traces in the patterned metal layer at the first side of the substrate with traces in the patterned metal layer at the land side, to z-interconnect bond fingers 66.

The second substrate z-interconnect pads (bond fingers) 66 are formed by patterning regions of the metal layer situated at the margin on the first side of the second package substrate 12. The margin extends beyond the footprint of the stacked first package substrate 112, which for a matrix molded and saw-singulated CSP first package is substantially the same as the CSP package molding 217; this footprint is indicated by the broken line 68 in FIG. 6B. The width of the margin can be less about 1 mm, and, in order to provide adequate clearance for the wire bonding the width of the margin may preferably be greater than about 0.2 mm. Nominally in some embodiments the margin is about 0.5 mm.

As noted above, z-interconnect the bond fingers at the first side of the second substrate are connected by traces in the metal layer on first side of the first package substrate by way of vias to traces and to z-interconnect wire bond fingers in the metal layer on the land side, where interconnection of the assembly is made to additional devices stacked over the assembly or to an underlying substrate (second level interconnection). The z-interconnect wires connect the bond fingers on the first side of the second package substrate to bond fingers on the land side of the first package substrate, and the first package die are interconnected as appropriate by way of the traces, wires, and vias to the pads on the land sides of the first package substrate, where interconnection of the assembly is made to an underlying substrate (second level interconnection) or to additional devices stacked over the assembly. In this way the die in the first package are interconnected as desired to exposed pads on the land sides of the first package substrate and the second substrate at the top and bottom of the completed assembly.

As suggested in the FIGs., the second substrate necessarily has a larger footprint than the first package substrate, to accommodate the z-interconnection between the package substrates. In the examples shown, z-interconnects are arranged along all four edges of the packages and, accordingly, the second package is both wider and longer than the first package. As may be appreciated, in some assemblies according to the invention, z-interconnection may be made between bond fingers on fewer than all four edges, as for example along only one edge, or along two opposite edges. In such embodiments (unless a larger die in the second substrate requires a larger footprint), the second package need be larger (longer or wider) than the first package only in one direction.

The first package may have any of a variety of functionalities. For example, the CSP package can be a DSP, ASIC, GPU; or, the CSP package can be a memory, such as Flash, DRAM, SRAM.

The processor chip in a flip chip bottom package according to this aspect of the invention can be, for example, an ASIC, or a GPU, or a CPU, often an ASIC. Where the bottom package is a memory package it can be a stacked die memory package. A shielded flip chip die-up bottom package can be particularly suitable for higher speed applications, particularly for RF frequency processing, as in mobile communications applications.

In still other configurations according to the invention, an additional package is attached to the assembly on an available (exposed) substrate surface, and preferably on the exposed land side of the second package substrate.

In some embodiments the additional package is attached to the assembly on the exposed land side of the second substrate. In such embodiments the assembly as shown for example in FIG. 1 or 2 can provide a useful platform upon which to stack components having additional functionalities, as shown for example in FIGS. 7A through 13. Because the second package substrate is fully exposed, it can accommodate any of a variety of component (die or package) configurations and sizes, and all that is required for compatibility of the assembly with the components is that the traces on the exposed second package substrate be suitably routed to accept the additional component.

Figure 7A:
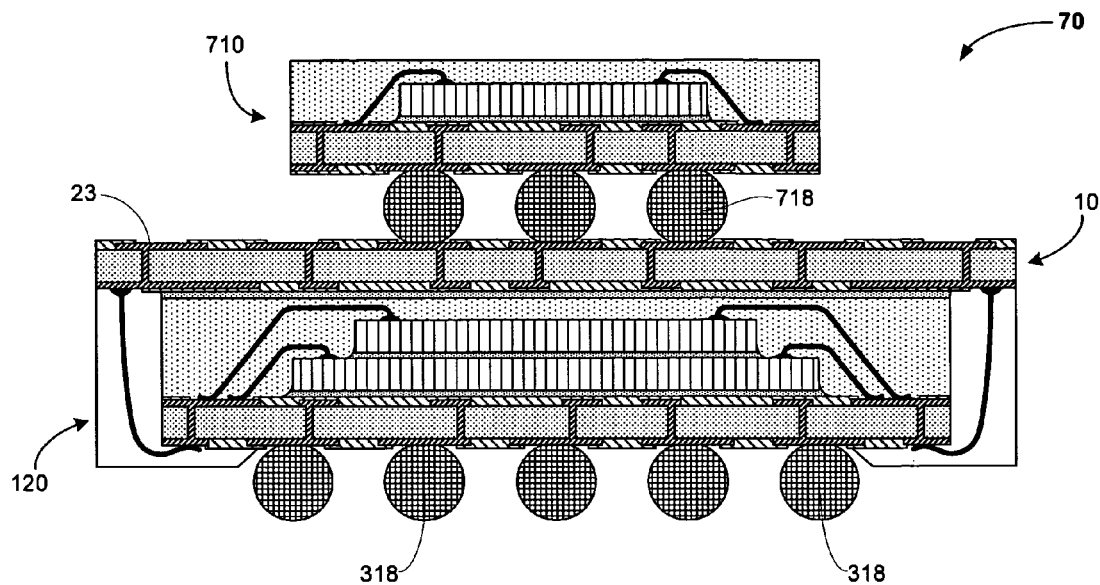
FIGS. 7A and 7B are diagrammatic sketches in a sectional view thru a semiconductor assembly according to embodiments of the invention, each including a BGA stacked over the assembly.
Figure 7B:
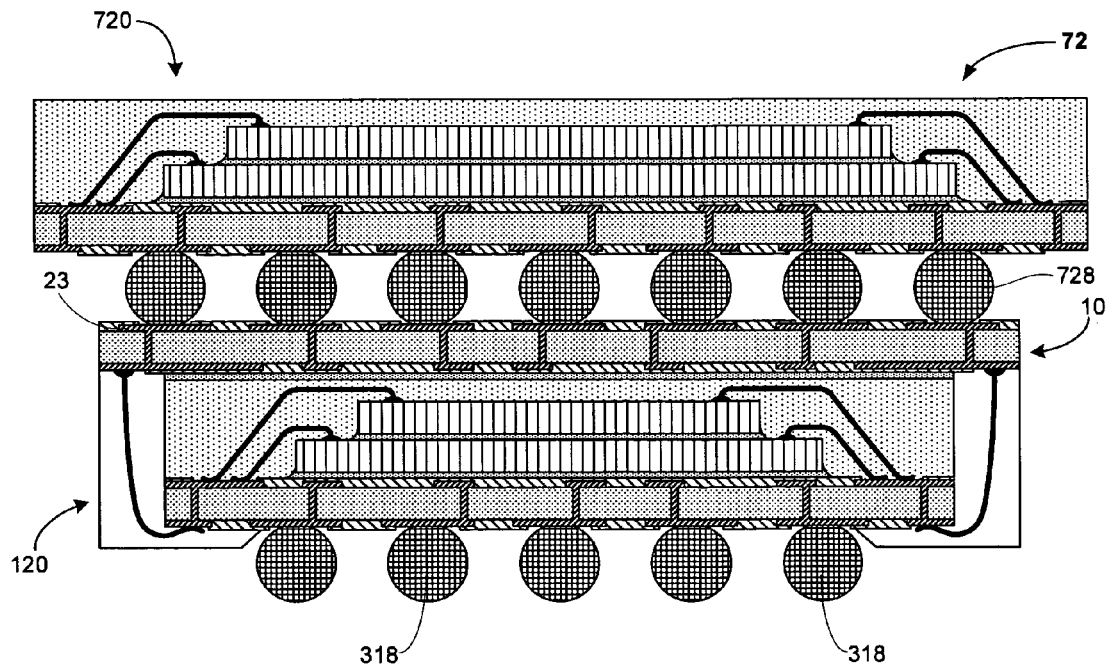

For example, as shown in FIGS. 7A and 7B a ball grid array (BGA) package can be mounted over an assembly constructed as described above with reference to FIG. 3. In FIG. 7A, a BGA package 710 having interconnect solder balls 718 is aligned with and mounted upon the land side of a second package 10 substrate, and the solder balls are reflowed onto ball pads in the metal layer 23 to form a module 70. Here the BGA footprint is smaller than that of the assembly; in the module 72 shown in FIG. 7B, the footprint of the BGA 720 is larger than that of the assembly, and the ball array has more interconnect solder balls, which accordingly occupy more ball pads on the second package 10 substrate. Also, in the example of FIG. 7B, the BGA is a stacked die package, while in FIG. 7A the BGA is a single die package.

Figure 8A:
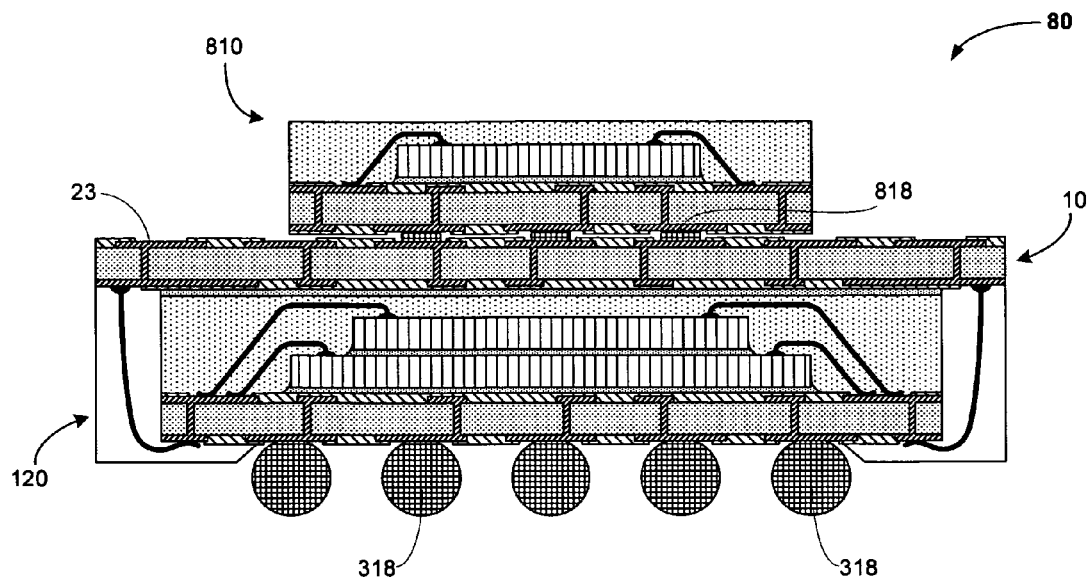
FIGS. 8A and 8B are diagrammatic sketches in a sectional view thru a semiconductor assembly according to embodiments of the invention, each including a LGA stacked over the assembly.
Figure 8B:
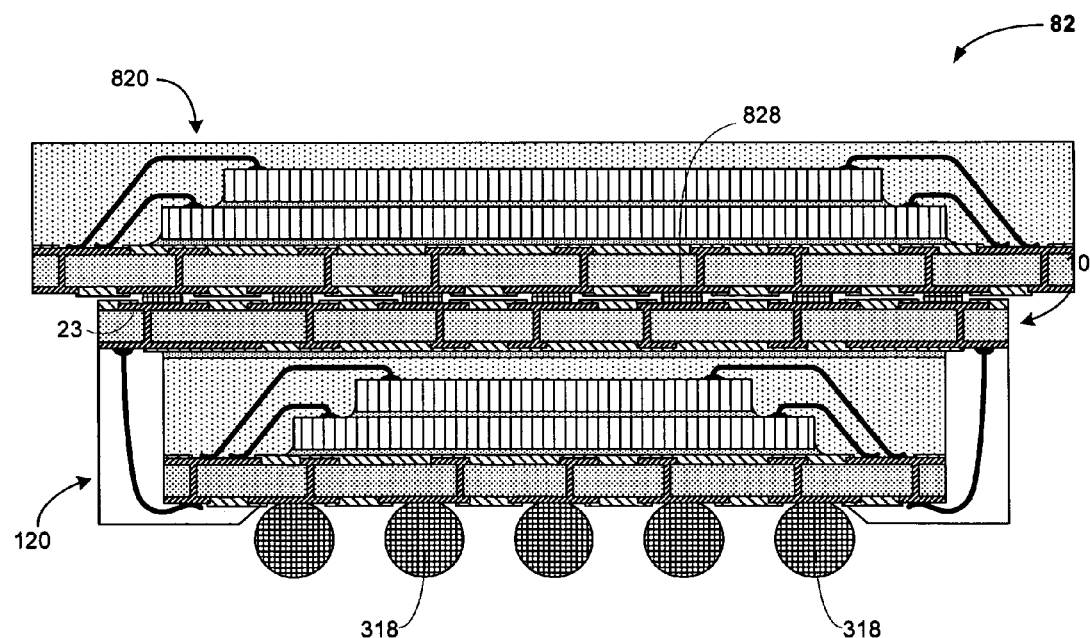

And for example, as shown in FIGS. 8A and 8B an additional land grid array (LGA) package can be mounted over an assembly constructed as described above with reference to FIG. 3. In FIG. 8A, a LGA package 810 having land interconnects 818 is aligned with and mounted upon the land side of a second package 10 substrate, and the land interconnects are reflowed onto pads in the metal layer 23 to form a module 80. Here the LGA footprint is smaller than that of the assembly; in the module 82 shown in FIG. 8B, the footprint of the LGA 820 is larger than that of the assembly, and the array has more land interconnects, which accordingly occupy more pads on the second package 10 substrate. Also, in the example of FIG. 8B, the LGA is a stacked die package, while in FIG. 8A the LGA is a single die package.

A configuration having a larger additional package mounted over the stacked package assembly as shown in FIGS. 7A and 8A may, for example, include processors in the first package 10, and a memory package as the additional package 720 or 820. The minimum sizes of footprints of the CSP 100 and of the second substrate 10 in the assembly are determined principally by the dimensions of the die in the first package, and this generally relates to the functionality of the die. ASICs may be comparatively very small, for example, and different processors may be of significantly different sizes. Memory die, on the other hand, may be comparatively large. A digital signal processor (DSP) package, for example, has a footprint typically in the range 12×12 mm to 16×16 mm. A memory package, on the other hand, for example, typically has a footprint in the range 8×10 mm to 18×18 mm. Accordingly, if the assembly as in FIG. 3 includes a DSP in the first package 10 of the assembly, establishing a footprint of 16×16 mm for the assembly 3, the manufacturer may according to the specifications of the customer select either a smaller LGA memory package (e.g. 810 in FIG. 8A, giving a module 80) or a larger LGA memory package (e.g. 820 in FIG. 8B, giving a module 82). Thus, for embodiments as in FIGS. 7A, 7B, 8A, 8B, the manufacturer can mix-and-match assembly platforms with selected memory BGAs or LGAs according to function (memory capacity and speed; memory type) and according to costs from various suppliers.

Figure 9:
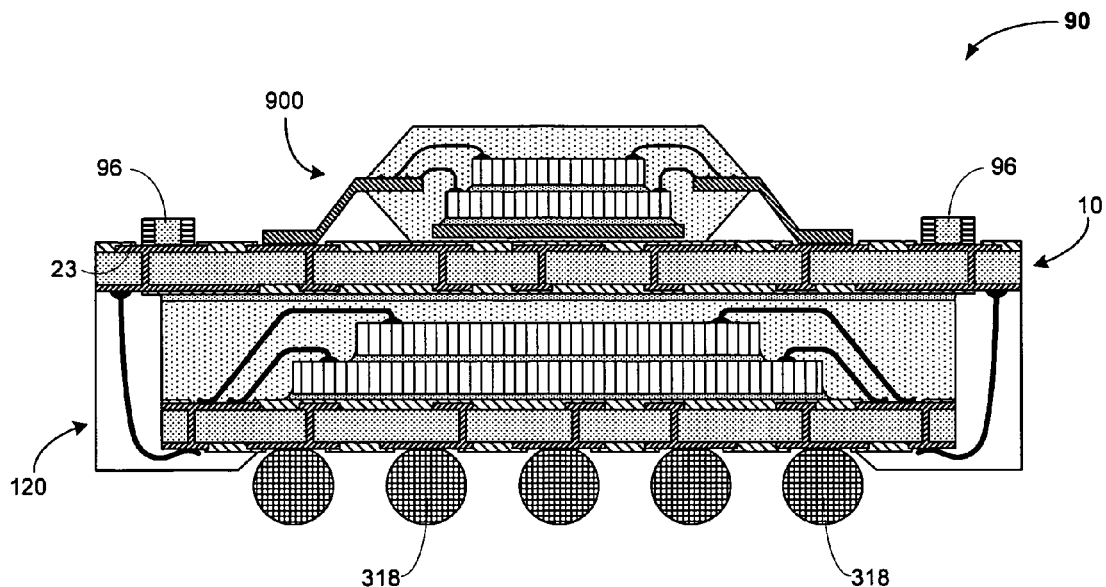
FIG. 9 is a diagrammatic sketch in a sectional view thru a semiconductor assembly according to an embodiment of the invention, including a SD QFP stacked over the assembly.
Figure 10:
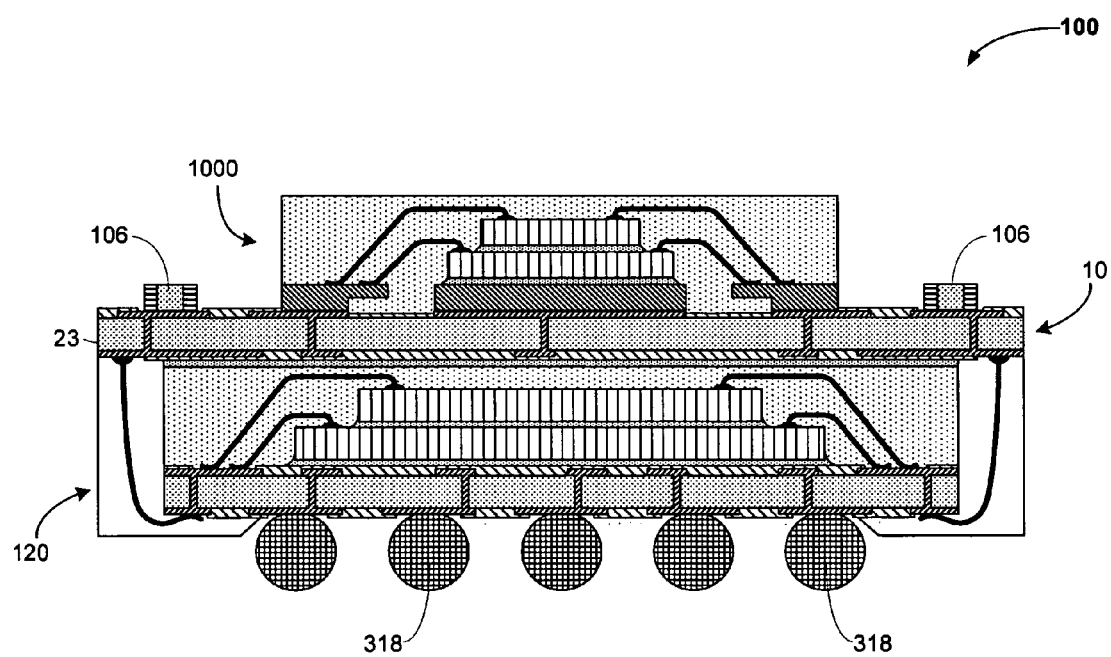
FIG. 10 is a diagrammatic sketch in a sectional view thru a semiconductor assembly according to an embodiment of the invention, including a SD QFN/LFCSP stacked over the assembly.
Figure 11:
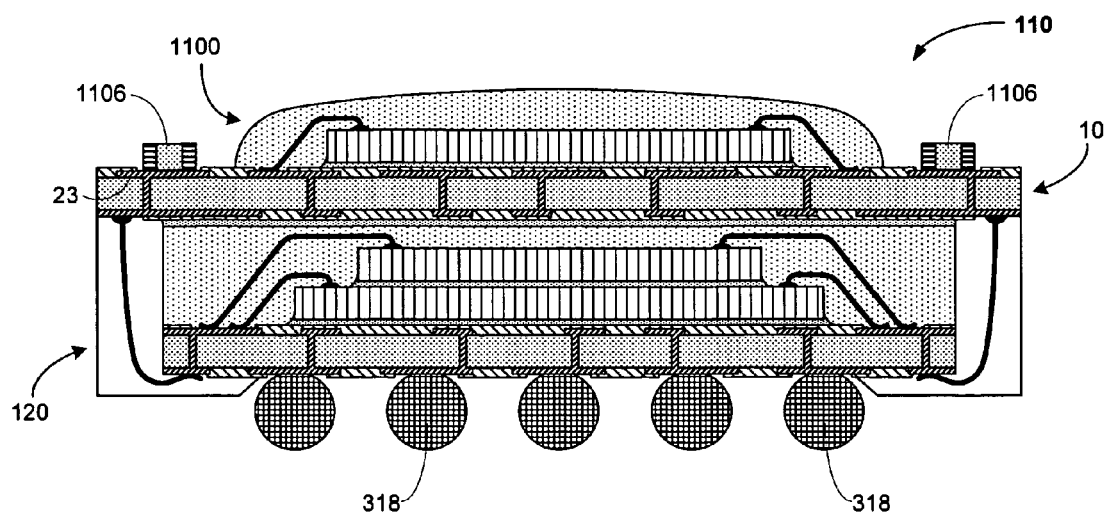
FIG. 11 is a diagrammatic sketch in a sectional view thru a semiconductor assembly according to an embodiment of the invention, including a wire bonded die stacked over the assembly.
Figure 12:
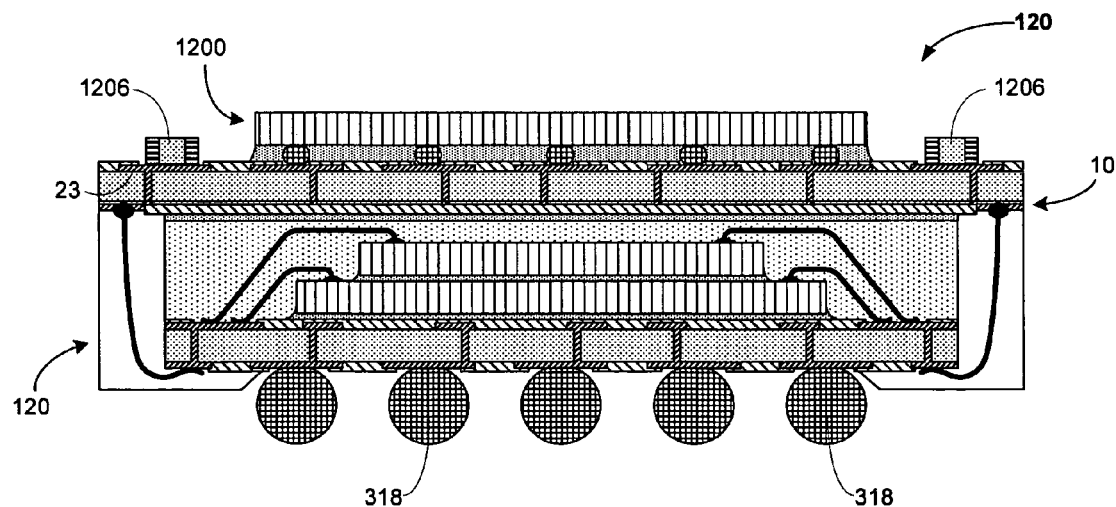
FIG. 12 is a diagrammatic sketch in a sectional view thru a semiconductor assembly according to an embodiment of the invention, including a flip chip die stacked over the assembly.
Figure 13:
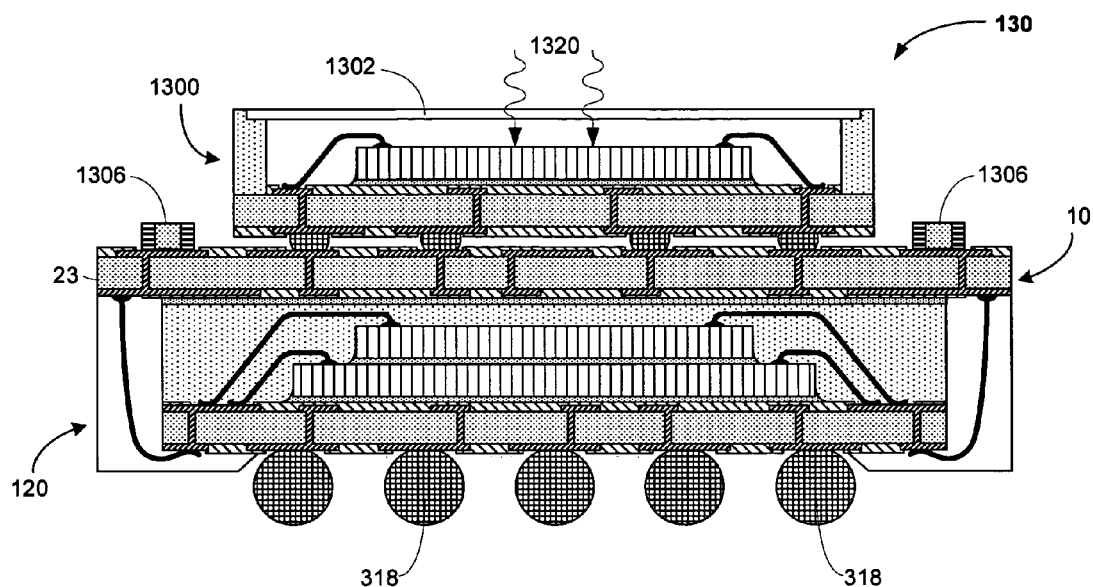
FIG. 13 is a diagrammatic sketch in a sectional view thru a semiconductor assembly according to an embodiment of the invention, including an optical sensor package stacked over the assembly.

Other additional components or devices can be mounted over the assembly, requiring only that the land side of the second substrate be suitably routed to accept electrical interconnections from the component. FIG. 9 shows a module 90 having a stacked die quad flat package 900, accompanied by passive devices 96, mounted over a semiconductor assembly constructed generally as in FIG. 3. FIG. 10 shows a module 100 having a stacked die quad flat nonleaded lead frame chip scale package 1000, accompanied by passive devices 106, mounted over a semiconductor assembly constructed generally as in FIG. 3. FIG. 11 shows a module 110 having a wire bonded die 1100, accompanied by passive devices 1106, mounted over a semiconductor assembly constructed generally as in FIG. 3; the die and wires are covered by a so-called "glop top" encapsulation, formed by syringe dispensing an encapsulating resin. FIG. 12 shows a module 120 having a flip chip mounted die 1200, accompanied by passive devices 1206, mounted over a semiconductor assembly constructed generally as in FIG. 3; an underfill protects the flip chip interconnects. FIG. 13 shows a module 130 having an optical sensor package 1300, which may be an image forming device, accompanied by passive devices 1306, mounted over a semiconductor assembly constructed generally as in FIG. 3; light passes through a transparent cover or lens as indicated by arrows 1320 to reach the active side of the wire-bonded light sensor die.

Figure 14:
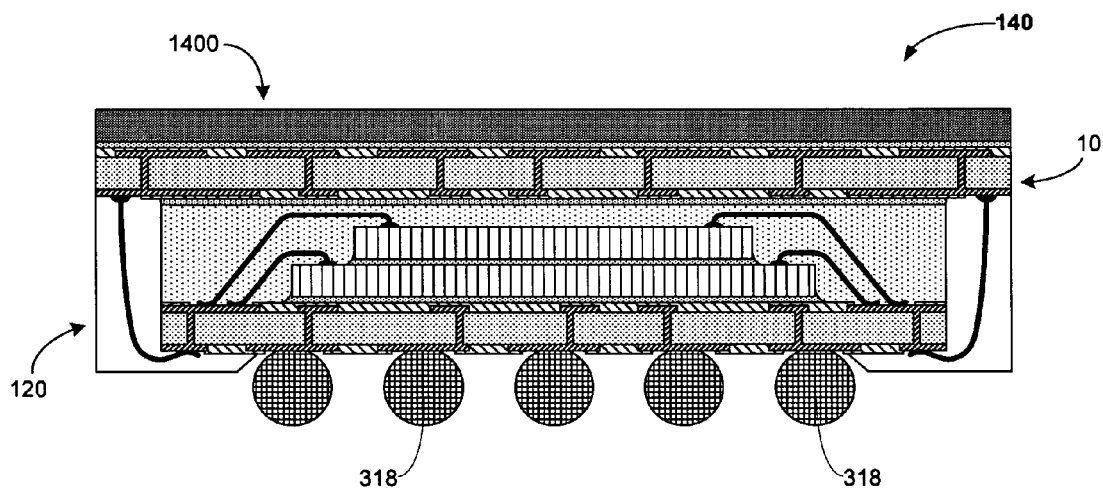
FIG. 14 is a diagrammatic sketch in a sectional view thru a semiconductor assembly according to an embodiment of the invention, including a heat spreader stacked over the assembly.

FIG. 14 shows an assembly 140, including a semiconductor assembly generally as shown in FIG. 3, having a heat spreader 1400 mounted upon the land side of the second package substrate.

In other embodiments the additional package is attached to the assembly on the exposed area of the land side of the first package substrate, in the cavity in the assembly encapsulation. In these embodiments the assembly of FIG. 1 or 2, with second level interconnection on the land side of second substrate, as shown in FIG. 4, can provide a useful platform upon which to stack components having additional functionalities, as shown for example in FIGS. 16 through 24. In embodiments employing the platform of FIG. 4, the traces on the first package substrate must suitably routed to accept the additional component.

Figure 18:
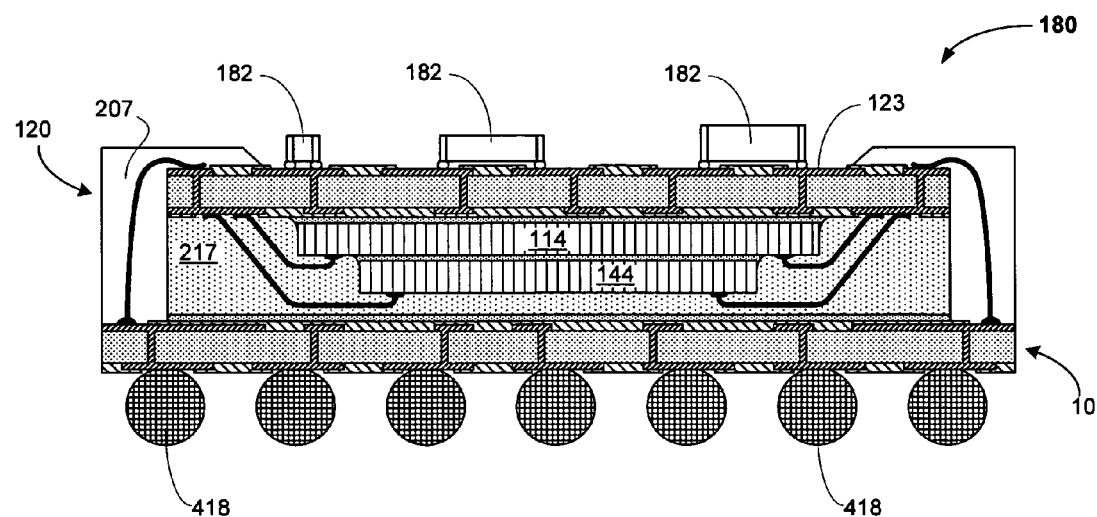
FIG. 18 is a diagrammatic sketch in a sectional view thru a stacked package assembly according to an embodiment of the invention, including passive devices mounted over an assembly according to an embodiment of the invention as shown in FIG. 4.
Figure 19:
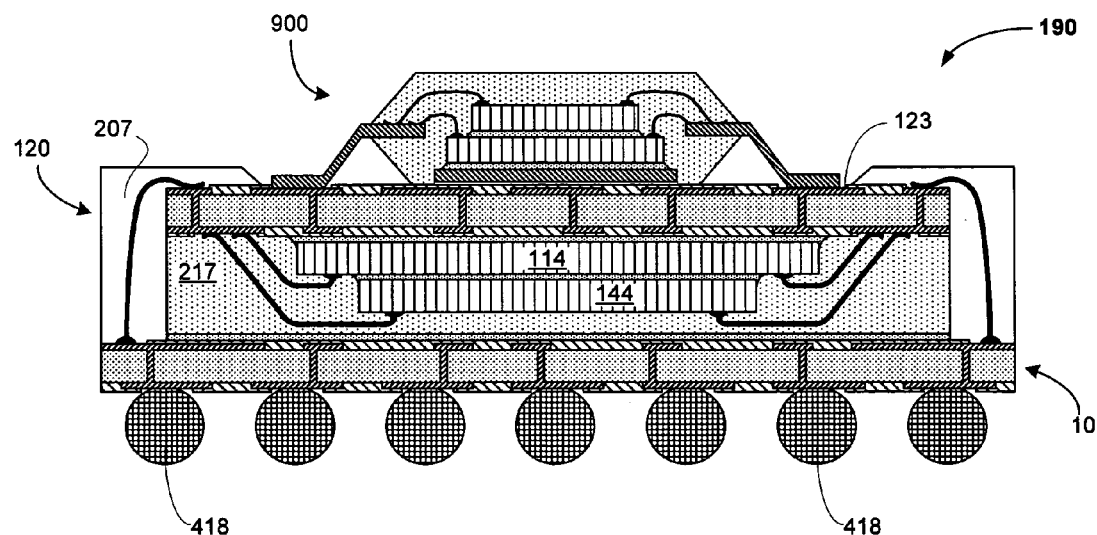
FIG. 19 is a diagrammatic sketch in a sectional view thru a stacked package assembly according to an embodiment of the invention, including a SD QFP stacked over an assembly according to an embodiment of the invention as shown in FIG. 4.
Figure 20:
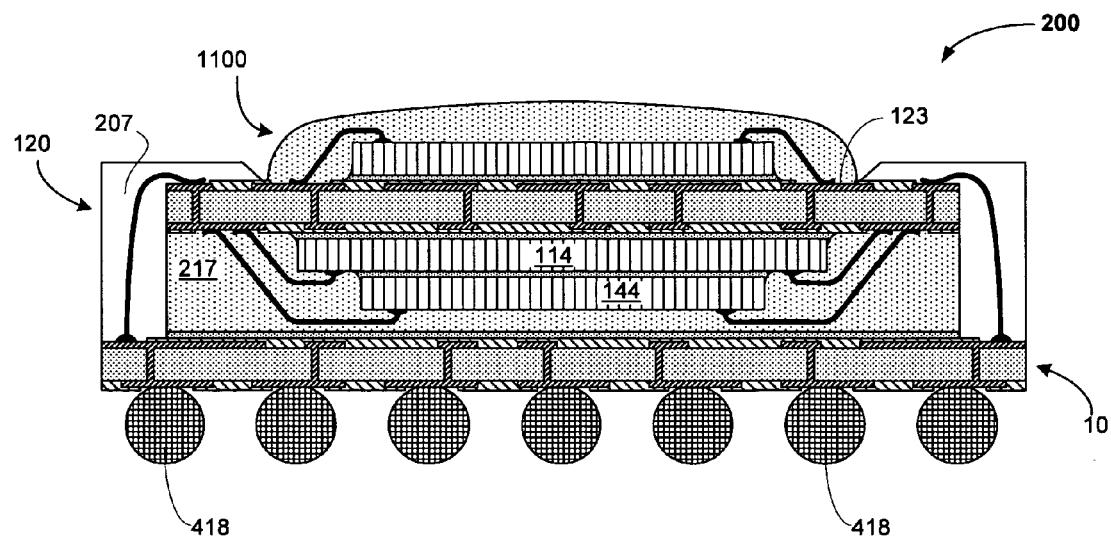
FIG. 20 is a diagrammatic sketch in a sectional view thru a stacked package assembly according to an embodiment of the invention, including a wire bonded die stacked over an assembly according to an embodiment of the invention as shown in FIG. 4.
Figure 21:
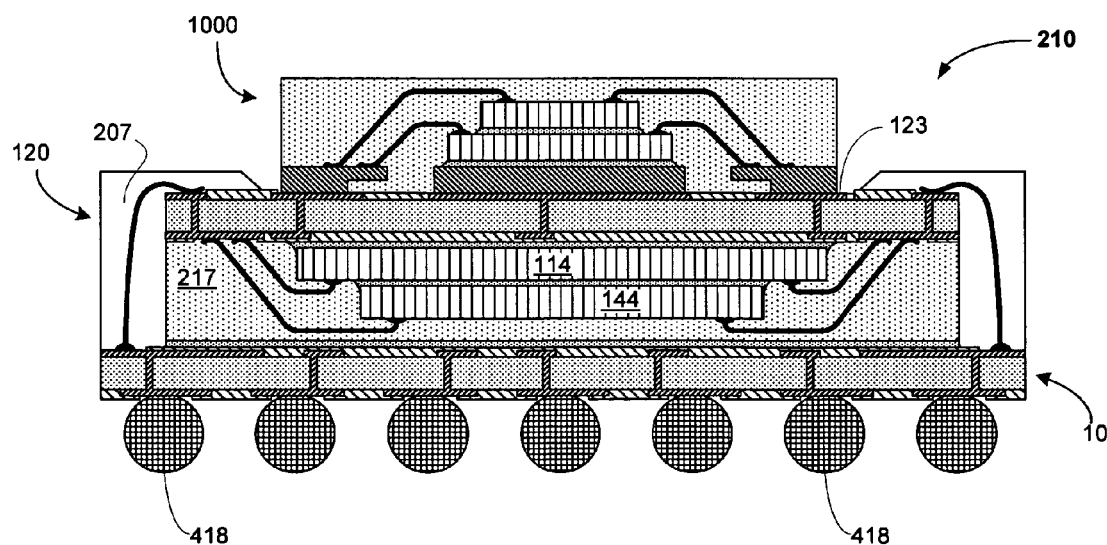
FIG. 21 is a diagrammatic sketch in a sectional view thru a stacked package assembly according to an embodiment of the invention, including a SD QFN/LFCSP stacked over an assembly according to an embodiment of the invention as shown in FIG. 4.
Figure 22:
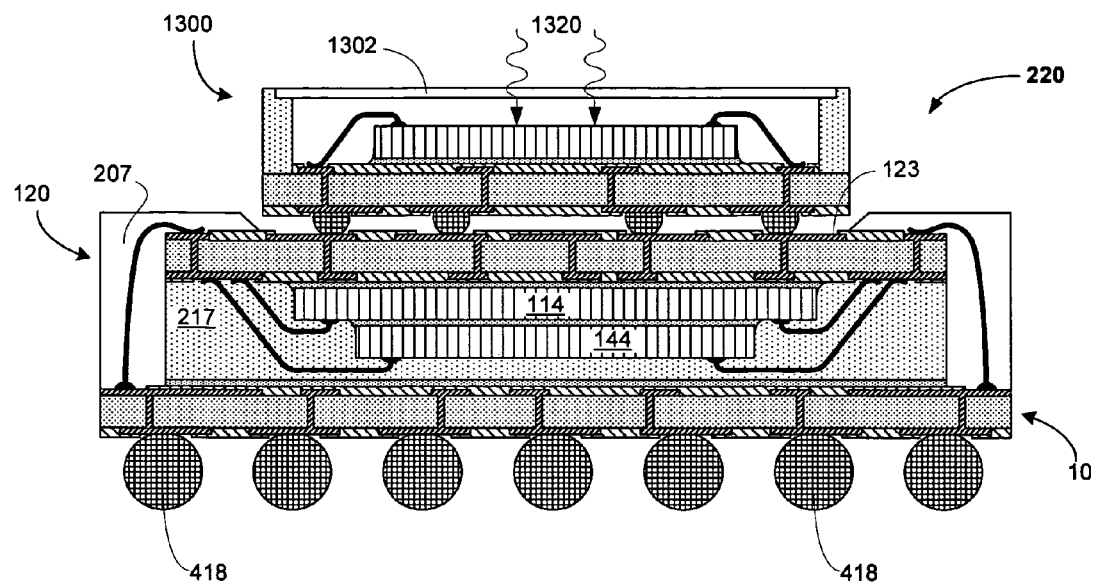
FIG. 22 is a diagrammatic sketch in a sectional view thru a stacked package assembly according to an embodiment of the invention, including an optical sensor package stacked over an assembly according to an embodiment of the invention as shown in FIG. 4.
Figure 23:
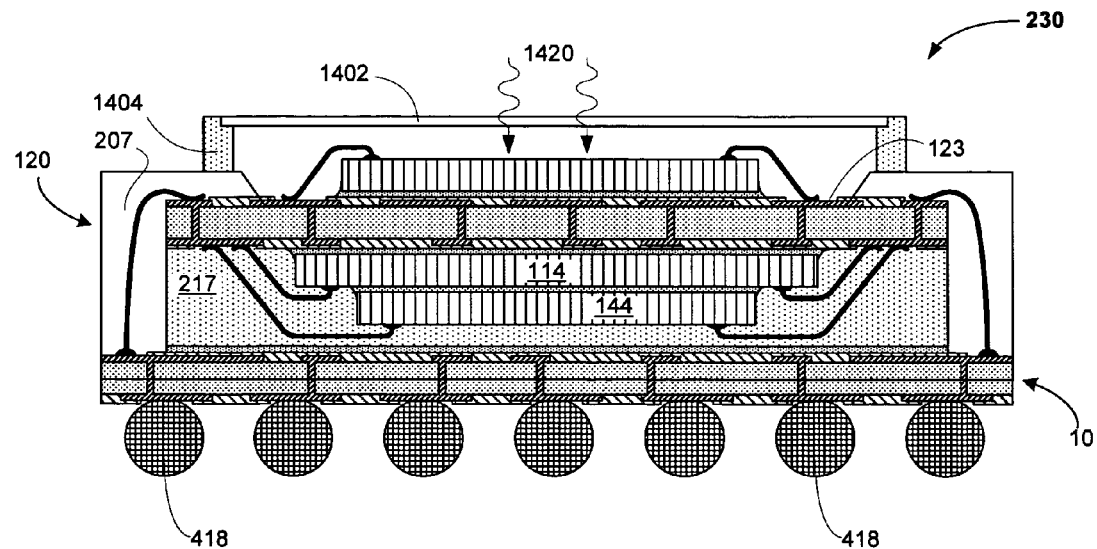
FIG. 23 is a diagrammatic sketch in a sectional view thru a stacked package assembly according to an embodiment of the invention, including an optical sensor die mounted on an assembly according to an embodiment of the invention as shown in FIG. 4.

For example, as shown in FIG. 16 a ball grid array (BGA) package can be mounted over an assembly constructed as described above with reference to FIG. 4. In FIG. 16, a BGA package 710 having interconnect solder balls 718 is aligned with and mounted upon the exposed area of the land side of a first package 100 substrate, and the solder balls are reflowed onto ball pads in the metal layer 123 to form a module 160. And for example, as shown in FIG. 17 an additional die can be mounted and electrically connected in a flip chip manner over an assembly constructed as described above with reference to FIG. 4. In FIG. 17, a flip chip 1200 is aligned with and mounted in the cavity upon the exposed area of the land side of a first package 100 substrate and connected to pads 123 to form a module 170. And for example, as shown in FIG. 18 additional passive devices can be mounted and electrically connected over an assembly constructed as described above with reference to FIG. 4. In FIG. 18, passive devices 182 are mounted in the cavity upon the exposed area of the land side of a first package 100 substrate and connected to pads 123 to form a module 170. And for example, as shown in FIG. 19 a stacked die quad flat package, can be mounted and electrically connected over an assembly constructed as described above with reference to FIG. 4. In FIG. 19, stacked die quad flat package 900 is mounted in the cavity upon the exposed area of the land side of a first package 100 substrate and connected to pads 123 to form a module 180. And for example, as shown in FIG. 20 an additional die can be mounted and electrically connected by wire bonding over an assembly constructed as described above with reference to FIG. 4. In FIG. 20, a die 1100 is mounted active side upward in the cavity upon the exposed area of the land side of a first package 100 substrate and connected by wire bonds to pads 123 to form a module 200. And for example, as shown in FIG. 21 a stacked die quad flat nonleaded lead frame chip scale package 1000 is mounted over a stacked package assembly constructed generally as in FIG. 4. In FIG. 21, stacked die quad flat nonleaded lead frame CSP 1000 is mounted in the cavity upon the exposed area of the land side of a first package 100 substrate and connected to pads 123 to form a module 210. And for example, as shown in FIG. 22 an optical sensor package 1300, which may be an image forming device, is mounted over a stacked package assembly constructed generally as in FIG. 4. In FIG. 22 optical sensor package 1300 is mounted in the cavity upon the exposed area of the land side of a first package 100 substrate and connected to pads 123 to form a module 220. Light passes through a transparent cover or lens 1302 as indicated by arrows 1320 to reach the active side of the wire-bonded light sensor die. And for example, as shown in FIG. 23, an optical sensor die, which may be an image forming device, is mounted over a stacked package assembly constructed generally as in FIG. 4. In FIG. 23 the die is connected by wire bonds to pads 123 to form a module 230. A transparent cover or lens 1402 is supported by a frame 1404 mounted upon the assembly encapsulation 107. Light passes through the transparent cover or lens 1402 as indicated by arrows 1420 to reach the active side of the wire-bonded light sensor die.

Figure 24:
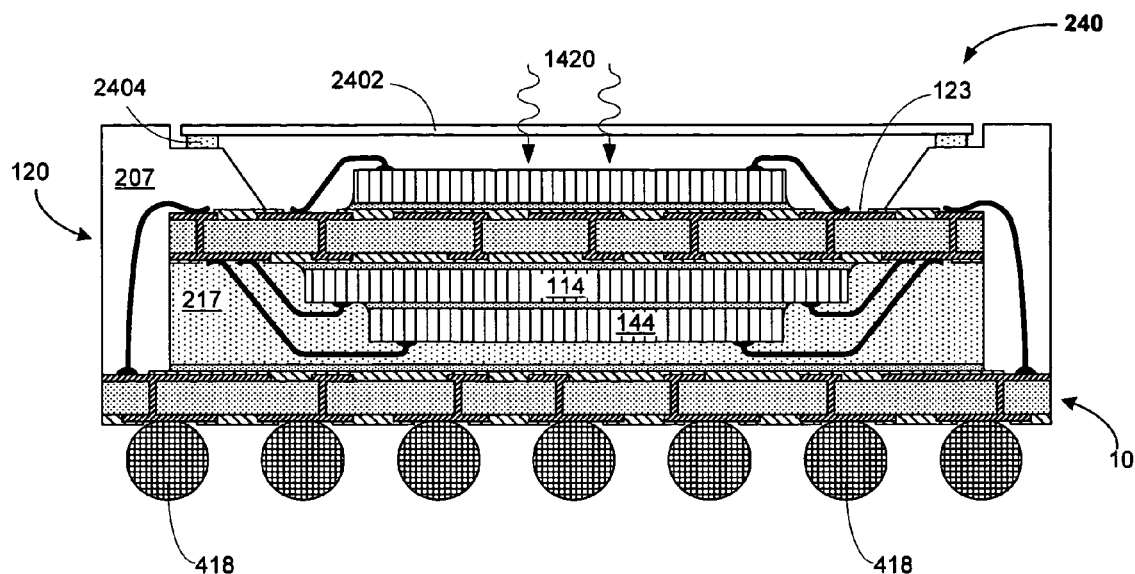
FIG. 24 is a diagrammatic sketch in a sectional view thru a stacked package assembly according to another embodiment of the invention, including an optical sensor die mounted on an assembly according to an embodiment of the invention as shown in FIG. 4.

As shown in FIG. 24, the cavity assembly encapsulation 247 is configured and dimensioned to accommodate the thickness of an optical sensor die mounted onto and electrically connected with the stacked package assembly as in FIG. 23, and a transparent cover or lens 2402 is supported by a perimeter seal 2404 mounted within a recess in the assembly encapsulation 247.

As will be appreciated, in all its various aspects the invention features an assembly having a first (CSP) package and a second substrate stacked over the CSP package, and having wire bonding z-interconnect between the first package substrate and the second substrate, in which the assembly is encapsulated in such a way that the land side of the second substrate is exposed and a portion of the land side of the first (CSP) package is exposed.

Moreover, the assembly constitutes a platform for combination with any of a variety of additional components. Accordingly, in various configurations second level interconnection of the assembly is made at the land side of one of the substrates (preferably the first package substrate), and one or more additional, components are stacked over the land side of the other substrate (preferably the second substrate). The additional components may be selected by the manufacturer on the product assembly floor, and may be selected from among off-the-shelf components.

The semiconductor assembly of the invention can be employed in any of a diverse variety of applications, such as, for example, computers, portable communications devices, consumer products.

The semiconductor assembly according to the invention can be used for building computers, and, for example, in telecommunications, consumer and industrial electronics devices. The invention provides for assembly of more than one semiconductor in a thin and minimal footprint package at high final test yields. Construction of the individual packages allows testing before they are assembled into the assembly, assuring that only acceptably good package components are employed in assembly and, accordingly, ensuring high assembly yields.

The invention provides for flexibility in design, particularly in selection of components having selected functionalities, and enables the use of standard packages, reducing the need for custom design and reducing cost.

Procedures in processes for making CSPs and for routing package substrates for use in the invention are well established in the industry.

The assembly process is similar for the configurations according to the various aspects of the invention. Generally, the process includes steps of providing a second substrate, preferably as a strip or matrix of substrates, providing a CSP (such as a matrix molded and saw singulated CSP) including a CSP package substrate and at least one die, inverting the CSP package in relation to the LGA package, applying adhesive onto a surface of the molding of the CSP package, inverting the CSP and placing the inverted CSP upon the second substrate so that the adhesive contracts a surface of the substrate, curing the adhesive, and forming z-interconnects between the CSP substrate and the second substrate.

Advantageously, the package can be tested prior to assembly, and packages not meeting requirements for performance or reliability can be discarded, so that first packages tested as "good" are used in the assembled module. Testing of CSPs is well established in the industry, and typically is done by accessing contact to the solder ball pads. The completed assembly can be tested in the same manner as for testing BGAs.

Figure 15:
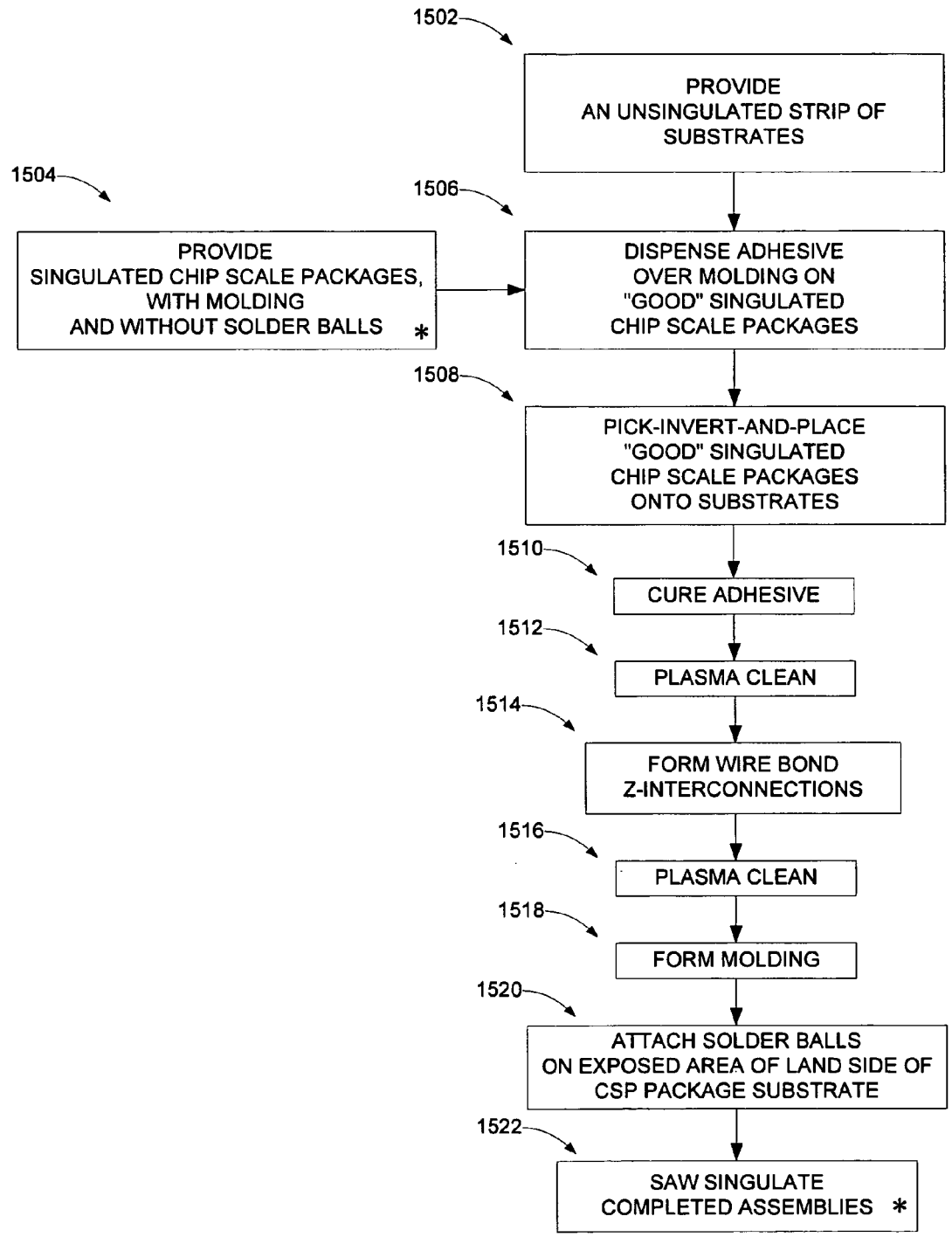
FIG. 15 is a diagram showing steps in a process for making a semiconductor assembly according to an embodiment of the invention as in FIG. 3.

FIG. 15 is a flow diagram showing a process for assembly of a stacked package assembly as shown for example in FIG. 3. In a step 1502, an unsingulated strip of substrates is provided. In a step 1504, singulated chip scale packages are provided. The singulated CSP packages are protected by a molding, and preferably are tested (*) and identified as "good". In a step 1506, adhesive is dispensed over the upper surface of the molding on "good" singulated CSP packages. In a step 1508, a pick-and-place operation is carried out to invert and place "good" CSP packages on the substrates in the strip; the adhesive is then situated between the surface of the first package molding and the first surface of the substrate. In a step 1510, the adhesive is cured. In a step 1512, a plasma clean operation is performed in preparation for a step 1514 in which wire bond z-interconnections are formed between wire bond sites on the land side of the CSP and the first side of the second substrate. In a step 1516, an additional plasma clean may be performed, followed by the formation of the stacked package assembly molding in a step 1518. The molding apparatus is configured to allow molding compound to encapsu-late the z-interconnection wire loops, and to prevent incursion of molding compound into an inner area of the land side of the CSP. In a step 1520, the second-level interconnect solder balls are attached to the exposed inner area of the land side of the CSP. In a step 1522, the completed assemblies are tested (*) and singulated from the strip by saw singulation, and packaged for further use.

Figure 25:
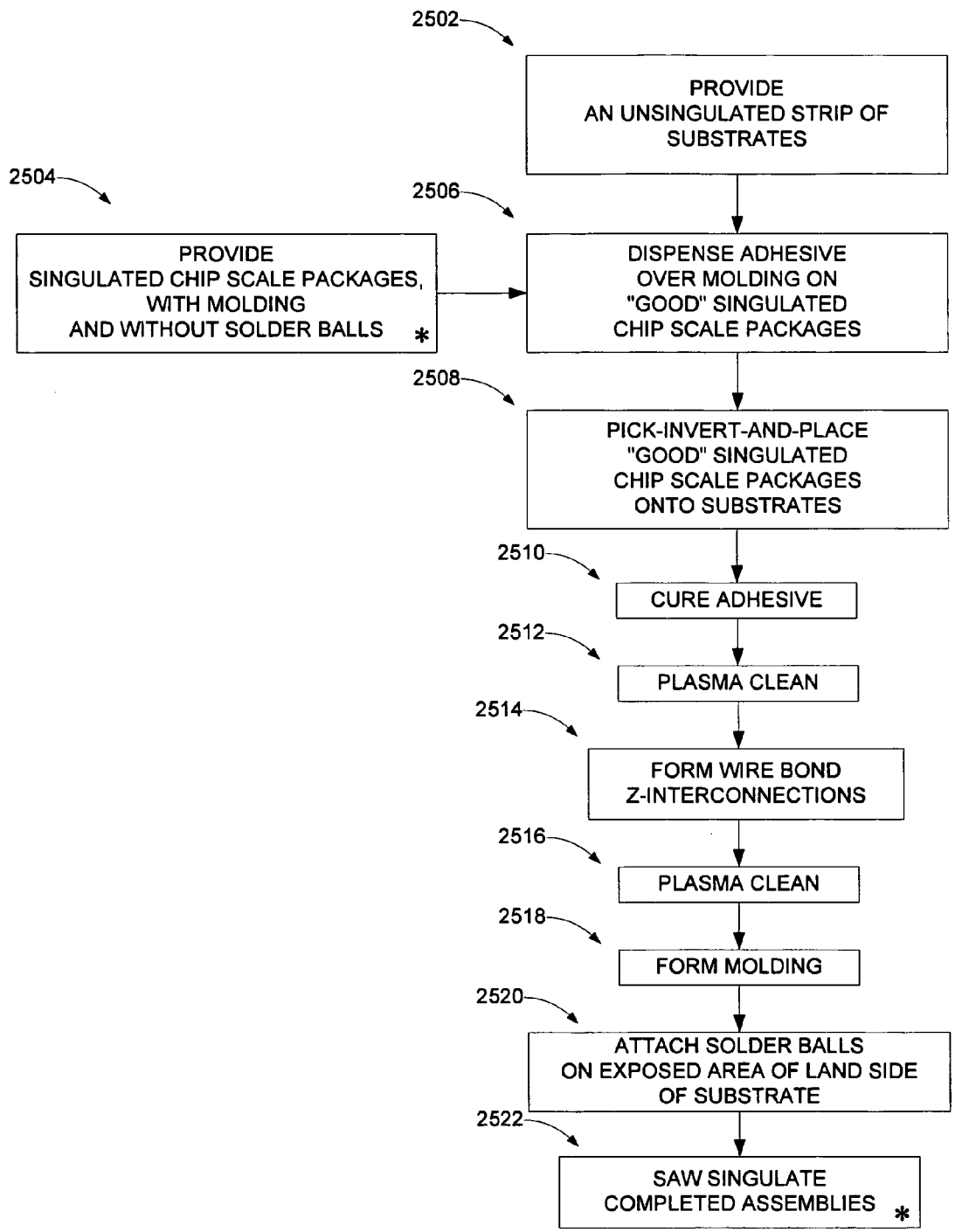
FIG. 25 is a diagram showing steps in a process for making a stacked package assembly according to an embodiment of the invention as in FIG. 4.

FIG. 25 is a flow diagram showing a process for assembly of a stacked package assembly as shown for example in FIG. 4. In a step 2502, an unsingulated strip of substrates is provided. In a step 2504, singulated chip scale packages are provided. The singulated CSP packages are protected by a molding, and preferably are tested (*) and identified as "good". In a step 2506 adhesive is dispensed over the molding on the CSPs. In a step 2506, In a step 2508, a pick-and-place operation is carried out to invert and place "good" CSP packages on the substrates. In a step 2510, the adhesive is cured. In a step 2512, a plasma clean operation is performed in preparation for a step 2514 in which wire bond z-interconnections are formed between wire bond sites on the land sides of the CSP and the LGA substrate. In a step 2516, an additional plasma clean may be performed, followed by the formation of the stacked package assembly molding in a step 2518. The molding apparatus is configured to allow molding compound to encapsulate the z-interconnection wire loops, and to prevent incursion of molding compound into an inner area of the land side of the CSP. In a step 2520, the second-level interconnect solder balls are attached to the exposed land side of the substrate. In a step 2522, the completed assemblies are tested (*) and singulated from the strip by saw singulation, and packaged for further use.

As will be appreciated, individual ones of the various steps in the processes according to the invention can be carried out, according to the methods described herein, using substantially conventional techniques, with straightforward modification, as described herein, of conventional fabrication facilities. Such variation of conventional techniques and modification of conventional fabrication apparatus as may be required can be accomplished using the description herein without undue experimentation.

Other embodiments are within the following claims.

What is claimed is:

1. A semiconductor assembly comprising:
    a first package comprising a first package substrate having a die attach side and a land side, the first package including at least one die affixed to, and electrically interconnected by wires bonds with, the die attach side of the first package substrate and encapsulated in a first encapsulant; and
    a second substrate, wherein the first package is inverted in relation to the substrate, and wherein z-interconnection of the first package substrate and the second substrate is by wire bonds connecting the first package substrate and the second substrate, the assembly further being encapsulated in a second encapsulant so that both the second substrate at one side of the assembly and a portion of the first package substrate at an opposite side of the assembly are exposed, whereby second level interconnection and interconnection with additional components may be made.

2. The semiconductor assembly of claim 1 further comprising second level interconnections at the exposed land side of the second substrate.

3. The semiconductor assembly of claim 1 further comprising second level interconnections at the exposed portion of the land side of the first package substrate.

4. The semiconductor assembly of claim 1 wherein the second substrate is a land grid array package.

5. The semiconductor assembly of claim 1 wherein the first package is a matrix molded and saw singulated chip scale package.

6. The semiconductor assembly of claim 1, further comprising an assembly encapsulation.

7. The semiconductor assembly of claim 1 wherein the first package is a stacked die chip scale package.

8. The semiconductor assembly of claim 1 wherein the die in the first package is interconnected with the first package substrate by wire bonding.

9. The semiconductor assembly of claim 1 wherein the die in the first package is interconnected with the first package substrate by flip chip interconnection.

10. A semiconductor assembly comprising a first encapsulant encapsulating a land grid array substrate exposed at one side of the assembly and encapsulating a portion of a chip scale package substrate having a further encapsulated wire bonded die exposed at the opposite side of the assembly, further comprising second level interconnection at the exposed portion of the chip scale package substrate and having at least one additional component mounted at the exposed land grid array substrate.

11. The package assembly of claim 10 wherein the additional component includes at least one of: a ball grid array package, an additional land grid array package, a quad flat package, a quad flat nonleaded package, a lead frame chip scale package, a wire bonded die, a flip chip die, an optical sensor package, a micro-electro-mechanical sensor package, or a passive device.

12. A semiconductor assembly comprising a first encapsulant encapsulating a land grid array substrate exposed at one side of the assembly and encapsulating a portion of a chip scale package substrate having a further encapsulated wire bonded die exposed at the opposite side of the assembly, further comprising second level interconnection at the exposed land grid array substrate and having at least one additional component mounted at the exposed portion of the chip scale package substrate.

13. The package assembly of claim 12 wherein the additional component includes at least one of: a ball grid array package, an additional land grid array package, a quad flat package, a quad flat nonleaded package, a lead frame chip scale package, a wire bonded die, a flip chip die, an optical sensor package, a micro-electro-mechanical sensor package, or a passive device.

14. A method for making a semiconductor assembly, comprising: providing an LGA substrate; providing a singulated CSP; applying an adhesive onto the surface of the molding of the CSP package; inverting the CSP and placing the inverted CSP onto LGA substrate; curing the adhesive; performing a plasma clean on a land side of the CSP; wire bonding to form z-interconnection between the LGA substrate and the land side of the CSP; performing a plasma clean; performing a molding operation to enclose a side of the LGA, the z-interconnection wire bonds and wire loops, the edges of the CSP, and the marginal area on the land side of the CSP, leaving exposed the land side of the LGA substrate and an area of the land side of the CSP substrate located within a marginal area; and attaching second level interconnect solder balls to sites on the exposed area of the CSP substrate.

15. The method of claim 14, further comprising affixing and electrically connecting an additional component at the exposed side of the LGA subsstrate.

16. A method for making a semiconductor assembly, comprising: providing an LGA substrate; providing a singulated CSP; applying an adhesive onto the surface of the molding of the CSP package; inverting the CSP and placing the inverted CSP onto LGA substrate; curing the adhesive; performing a plasma clean on a land side of the CSP; wire bonding to form z-interconnection between the LGA substrate and the land side of the CSP; performing a plasma clean; performing a molding operation to enclose a side of the LGA, the z-interconnection wire bonds and wire loops, the edges of the CSP, and the marginal area on the land side of the CSP, leaving exposed the land side of the LGA substrate and an area of the land side of the CSP substrate located within a marginal area; and attaching second level interconnect solder balls to sites on the exposed side of the LGA package substrate.

17. The method of claim 16, further comprising affixing and electrically connecting an additional component at the exposed portion of the CSP substrate.

\* \* \* \* \*